(12) United States Patent
Nakao

(10) Patent No.: US 11,450,547 B2
(45) Date of Patent: Sep. 20, 2022

(54) METHOD FOR MANUFACTURING SEMICONDUCTOR DEVICE

(71) Applicant: Kioxia Corporation, Tokyo (JP)

(72) Inventor: Shinichi Nakao, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 45 days.

(21) Appl. No.: 17/202,055

(22) Filed: Mar. 15, 2021

(65) Prior Publication Data

US 2022/0084868 A1 Mar. 17, 2022

(30) Foreign Application Priority Data

Sep. 16, 2020 (JP) .............................. JP2020-155887

(51) Int. Cl.
| | | |
|---|---|---|
| *H01L 21/683* | (2006.01) | |
| *H01L 25/18* | (2006.01) | |
| *H01L 21/56* | (2006.01) | |
| *H01L 21/02* | (2006.01) | |

(52) U.S. Cl.
CPC ...... *H01L 21/6835* (2013.01); *H01L 21/0217* (2013.01); *H01L 21/02164* (2013.01); *H01L 21/02282* (2013.01); *H01L 21/02345* (2013.01); *H01L 21/56* (2013.01); *H01L 25/18* (2013.01); *H01L 2221/6835* (2013.01)

(58) Field of Classification Search
CPC ....... H01L 2221/68381; H01L 21/6835; H01L 2221/6835; H01L 2221/68318; H01L 21/02164; H01L 21/0217; H01L 21/02282; H01L 21/02345; H01L 21/56; H01L 25/18; H01L 2221/68363; H01L 27/10

See application file for complete search history.

(56) References Cited

U.S. PATENT DOCUMENTS

| | | | |
|---|---|---|---|
| 8,836,075 B2 | 9/2014 | Suguro | |
| 2005/0162578 A1* | 7/2005 | Yamazaki | ......... H01L 21/02675 349/143 |
| 2006/0110863 A1* | 5/2006 | Yamamoto | .............. H01L 24/73 438/149 |
| 2016/0284753 A1 | 9/2016 | Komai et al. | |
| 2019/0273090 A1* | 9/2019 | Fukuzumi | ............. H01L 21/185 |
| 2020/0075861 A1 | 3/2020 | Sugawara | |

FOREIGN PATENT DOCUMENTS

| | | |
|---|---|---|
| JP | 2013-69719 A | 4/2013 |
| JP | 2015-211044 A | 11/2015 |
| JP | 2018-120965 A | 8/2018 |
| JP | 2020-47937 A | 3/2020 |
| JP | 2019-61975 A | 4/2020 |

* cited by examiner

*Primary Examiner* — Selim U Ahmed
*Assistant Examiner* — Evan G Clinton
(74) *Attorney, Agent, or Firm* — Finnegan, Henderson, Farabow, Garrett & Dunner L.L.P.

(57) ABSTRACT

A semiconductor device of an embodiment is manufactured by forming a first layer by applying a liquid containing silicon oxide particles onto a first substrate, performing a first heat treatment, forming a second layer including a first insulator on the upper surface and the side surfaces of the first layer, forming a third layer including an electronic circuit on the second layer, bonding a second substrate including a semiconductor circuit to the third layer, and separating the first substrate and the second substrate at the first layer.

19 Claims, 28 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2020-155887, filed on Sep. 16, 2020, the entire contents of which are incorporated herein by reference.

FIELD

Embodiments described herein relate generally to a method for manufacturing a semiconductor device.

BACKGROUND

By a bonding technique, a support substrate on which an electronic circuit is formed and a semiconductor substrate on which another electronic circuit is formed are bonded to each other, so that a highly functional or highly integrated semiconductor device is obtained. For example, a support substrate on which a memory cell array is formed and a semiconductor substrate on which a control circuit for controlling the memory cell array is formed are bonded to each other. The unnecessary portions of the support substrate are then removed. The support substrate is ground from its back surface, for example, so that the unnecessary portions of the support substrate are removed.

After that, the resultant structure including the semiconductor substrate is divided into a plurality of chips by dicing, so that a highly functional or highly integrated semiconductor memory can be obtained.

As the unnecessary portions of the support substrate are removed prior to the dicing, a new support substrate is required for manufacturing a new semiconductor device with the bonding technique. To lower the manufacturing costs of a semiconductor device, a semiconductor device manufacturing method using a bonding technique that allows reuse of the support substrate is desired.

DETAILED DESCRIPTION

Figure 1A:
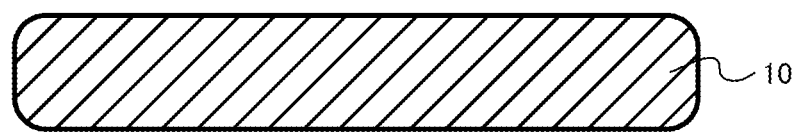
FIGS. 1A, 1B, and 1C are diagrams for explaining a method for manufacturing a semiconductor device according to a first embodiment.

A method for manufacturing a semiconductor device according to an embodiment includes: forming a first layer by applying a liquid containing silicon oxide particles onto a first substrate; performing a first heat treatment after the forming the first layer; forming a second layer including a first insulator on an upper surface and a side surface of the first layer, after the performing the first heat treatment; forming a third layer including an electronic circuit on the second layer; bonding a second substrate including a semiconductor circuit to the third layer; and separating the first substrate and the second substrate, the first substrate integrated with one part of the first layer and the second substrate integrated with another part of the first layer after the separating.

The following is a description of embodiments, with reference to the accompanying drawings. In the description below, like or similar components are denoted by like reference numerals, and explanation of components described once will not be repeated.

In the present specification, the terms "upper" and "lower" may be used for convenience. The terms "upper" and "lower" are terms that indicate a relative positional relationship in the drawings, for example. The terms "upper" and "lower" do not necessarily define the positional relationship with respect to gravity.

The qualitative analysis and the quantitative analysis of the chemical compositions of the members constituting a semiconductor device in the present specification can be conducted by secondary ion mass spectrometry (SIMS) and energy dispersive X-ray spectroscopy (EDX), for example. The thicknesses of the members constituting a semiconductor device, the distances between the members, and the like can be measured with a scanning electron microscope (SEM), for example.

First Embodiment

A method for manufacturing a semiconductor device according to a first embodiment includes: forming a first layer by applying a liquid containing silicon oxide particles onto a first substrate; performing a first heat treatment after the forming the first layer; forming a second layer including a first insulator on an upper surface and a side surface of the first layer, after the performing the first heat treatment; forming a third layer including an electronic circuit on the second layer; bonding a second substrate including a semiconductor circuit to the third layer; and separating the first substrate and the second substrate, the first substrate integrated with one part of the first layer and the second substrate integrated with another part of the first layer after the separating.

The method for manufacturing a semiconductor device according to the first embodiment is a method for manufacturing a semiconductor device using a bonding technique. The semiconductor device is a semiconductor memory, for example. The semiconductor memory is a three-dimensional NAND flash memory in which memory cells are three-dimensionally disposed, for example.

FIGS. 1A, 1B, 1C, 2, 3, 4, 5, 6, 7A, 7B, 8, 9, 10, 11, 12, 13A, and 13B are diagrams for explaining the method for manufacturing a semiconductor device according to the first embodiment.

Figure 1B:
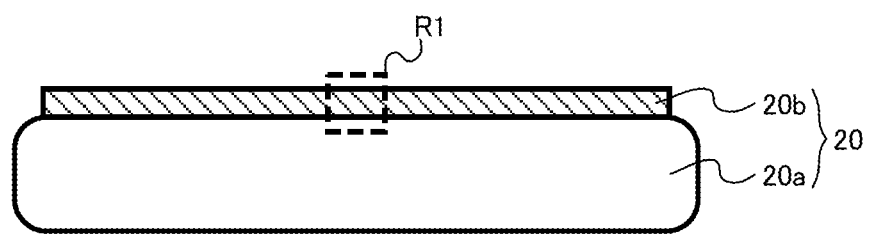
Figure 1C:
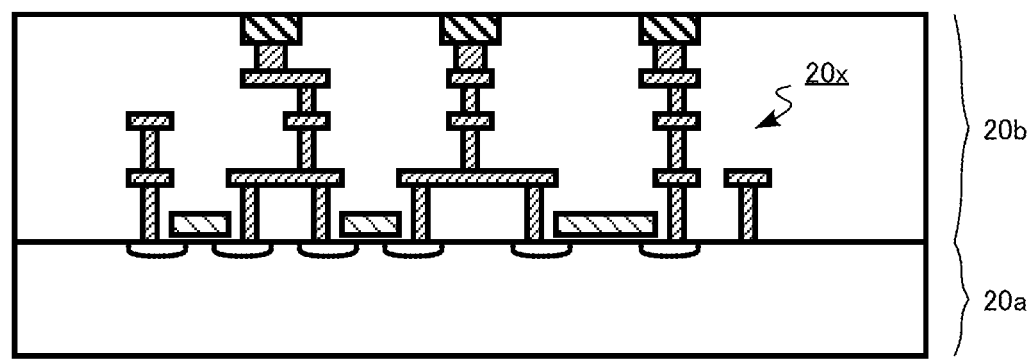

FIG. 1A is a schematic cross-sectional view of a support substrate. FIG. 1B is a schematic cross-sectional view of a semiconductor substrate. FIG. 1C is an enlarged schematic cross-sectional view of part of the semiconductor substrate. FIG. 1C is an enlarged view of a region R1 surrounded by a dashed line shown in FIG. 1B.

First, a support substrate 10 and a semiconductor substrate 20 are prepared. The support substrate 10 is an example of the first substrate. The semiconductor substrate 20 is an example of the second substrate.

The support substrate 10 is single-crystal silicon, for example. The support substrate 10 is a silicon substrate, for example.

As shown in FIG. 1B, the semiconductor substrate 20 includes a semiconductor layer 20$a$ and a wiring layer 20$b$, for example. The semiconductor layer 20$a$ is single-crystal silicon, for example. The semiconductor substrate 20 includes a silicon substrate, for example.

The semiconductor substrate 20 includes a control circuit 20$x$. The control circuit 20$x$ is an example of the semiconductor circuit.

The control circuit 20$x$ is formed with the semiconductor layer 20$a$ and the wiring layer 20$b$. The control circuit 20$x$ is formed with transistors and a multilayer wiring line connecting the transistors, for example. The control circuit 20$x$ is a CMOS circuit that includes an n-type transistor and a p-type transistor, for example.

Figure 2:
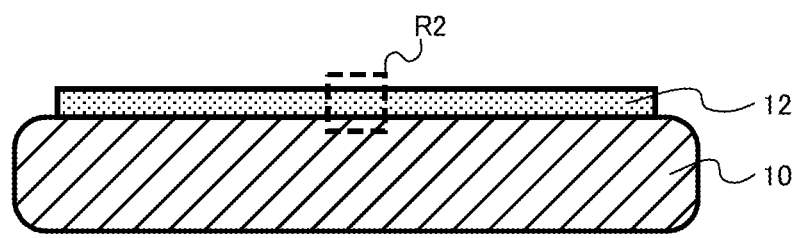
FIG. 2 is a diagram for explaining a method for manufacturing a semiconductor device according to the first embodiment.

Next, as shown in FIG. 2, a particle dispersion containing silicon oxide particles is applied onto the support substrate 10, to form a particle layer 12. The particle layer 12 is an example of the first layer. The particle dispersion containing silicon oxide particles is an example of the liquid.

Figure 3:
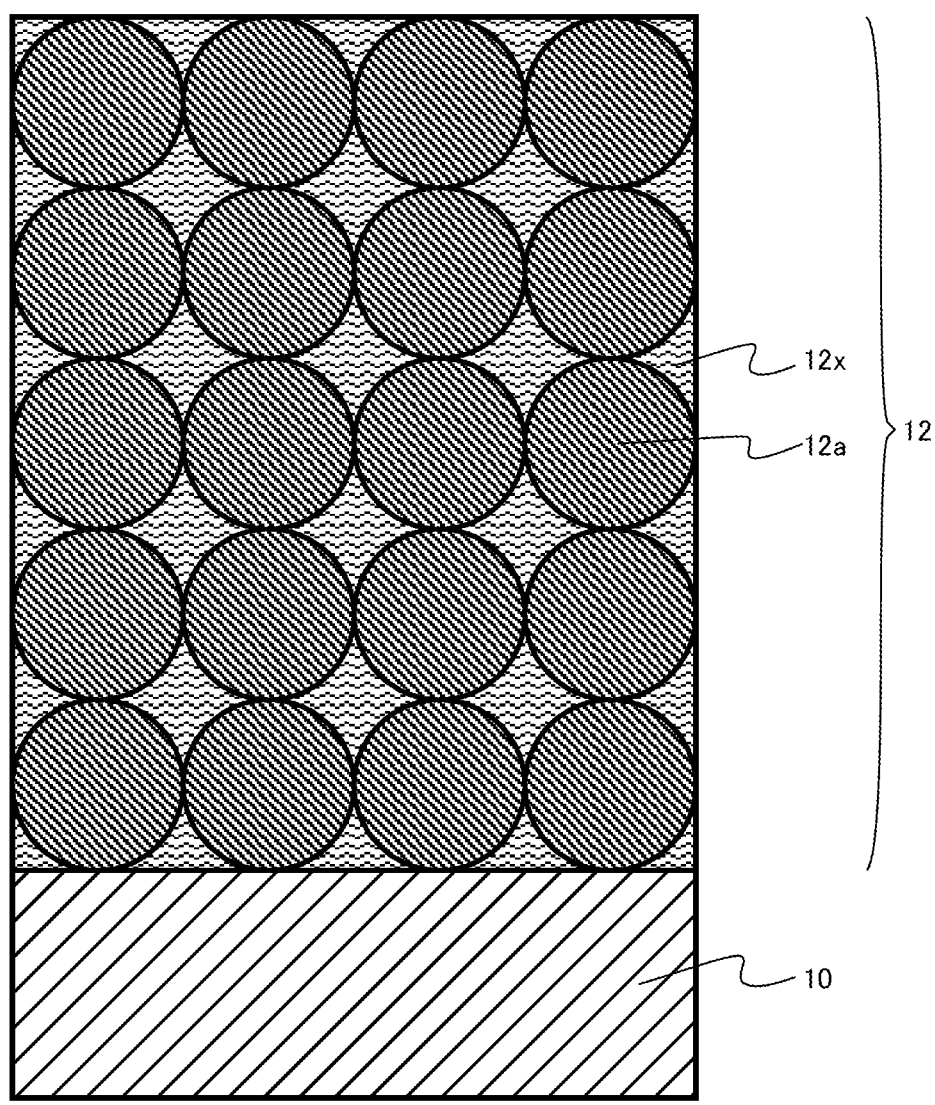
FIG. 3 is a diagram for explaining a method for manufacturing a semiconductor device according to the first embodiment.
Figure 4:
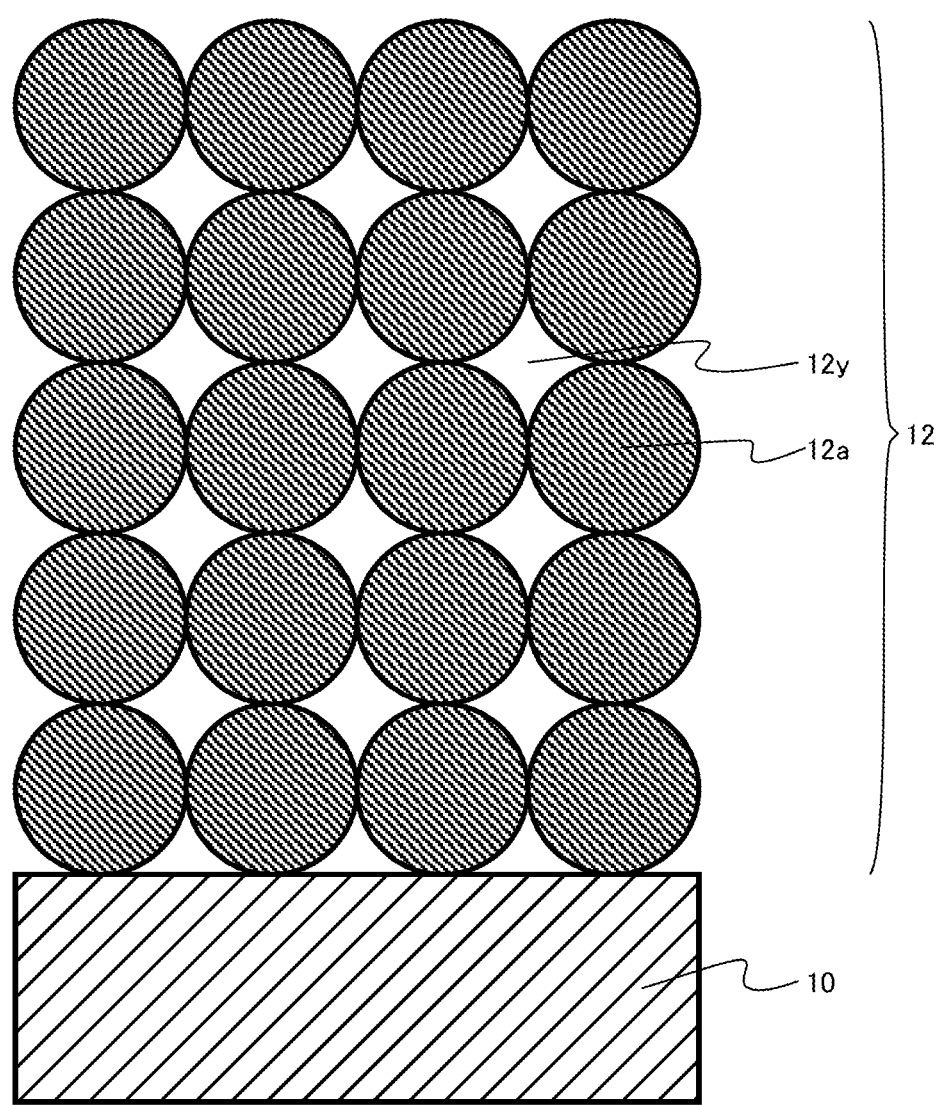
FIG. 4 is a diagram for explaining a method for manufacturing a semiconductor device according to the first embodiment.

FIGS. 3 and 4 are diagrams for explaining the formation of the particle layer 12. FIGS. 3 and 4 are enlarged views of a region R2 surrounded by a dashed line shown in FIG. 2.

As shown in FIG. 3, a particle dispersion in which silicon oxide particles 12$a$ are dispersed in a dispersion medium 12$x$ is applied onto the support substrate 10. The silicon oxide particles 12$a$ are dispersoids dispersed in the dispersion medium 12$x$.

The particle dispersion containing the silicon oxide particles 12$a$ is a colloidal solution. The particle dispersion containing the silicon oxide particles 12$a$ is colloidal silica, for example. The dispersion medium 12$x$ is water or an organic solvent, for example.

The particle dispersion in which the silicon oxide particles 12$a$ are dispersed is applied onto the support substrate 10 by a spin coat technique, for example.

After the application of the particle dispersion, the peripheral portion of the particle dispersion is removed by wet etching. After the application of the particle dispersion, so-called edge cutting is performed. As edge cutting is performed, the surface of the support substrate 10 is exposed through the outer peripheral portion of the particle layer 12.

The silicon oxide particles 12$a$ have a spherical shape, for example. The median particle size of the silicon oxide particles 12$a$ is equal to or more than 10 nm and equal to or less than 500 nm, for example.

The particle size of the silicon oxide particles 12$a$ is defined by an equivalent circle diameter, for example. An equivalent circle diameter is the diameter of a perfect circle corresponding to the area of a figure observed in a scanning electron microscope image (SEM image), for example. The particle size of the silicon oxide particles 12$a$ can be determined by image analysis of an SEM image, for example.

Next, a baking treatment is performed. The baking treatment is a heat treatment to be performed in an air atmosphere at a temperature equal to or higher than 100° C. and equal to or lower than 300° C., for example. The baking treatment removes at least part of the dispersion medium 12$x$.

Next, a first heat treatment is performed. The particle layer 12 is solidified by the first heat treatment. As shown in FIG. 4, the dispersion medium 12x is removed by the baking treatment and the first heat treatment, and the particle layer 12 is solidified.

Through the first heat treatment, the silicon oxide particles 12a are bound to one another. A void 12y is formed between a silicon oxide particle 12a and a silicon oxide particle 12a. The particle layer 12 turns into a porous layer. Some of the voids 12y may be formed by the baking treatment.

The temperature of the first heat treatment is equal to or higher than 800° C. and equal to or lower than 1200° C., for example. The first heat treatment is performed in a non-oxidizing atmosphere, for example. The first heat treatment is performed in a nitrogen atmosphere, for example.

The thickness of the particle layer 12 after the first heat treatment is equal to or more than 0.5 µm and equal to or less than 10 µm, for example.

Figure 5:
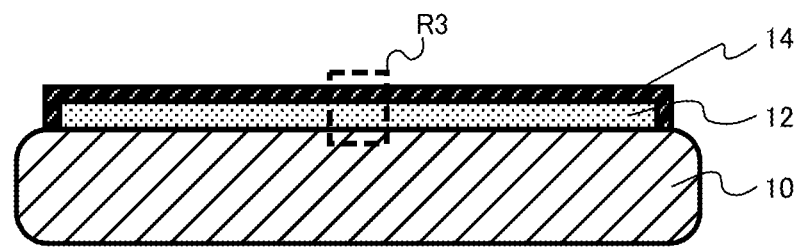
FIG. 5 is a diagram for explaining a method for manufacturing a semiconductor device according to the first embodiment.

Next, as shown in FIG. 5, a protective layer 14 is formed on the upper surface and the side surfaces of the particle layer 12. The protective layer 14 is an example of the second layer. The protective layer 14 is formed for planarizing the upper surface of the particle layer 12. The protective layer 14 is also formed to prevent etching of the particle layer 12 on the side surface when a memory layer 16 is formed later. The protective layer 14 is also formed to prevent the material at the time of film formation from entering the particle layer 12 from the side surfaces of the particle layer 12 when the memory layer 16 is formed later.

The protective layer 14 includes a first insulator. The first insulator is a silicon oxide, a silicon nitride, a silicon oxynitride, or a polysilicon layer, for example.

The protective layer 14 is formed by a plasma chemical vapor deposition technique (P-CVD technique), for example.

Figure 6:
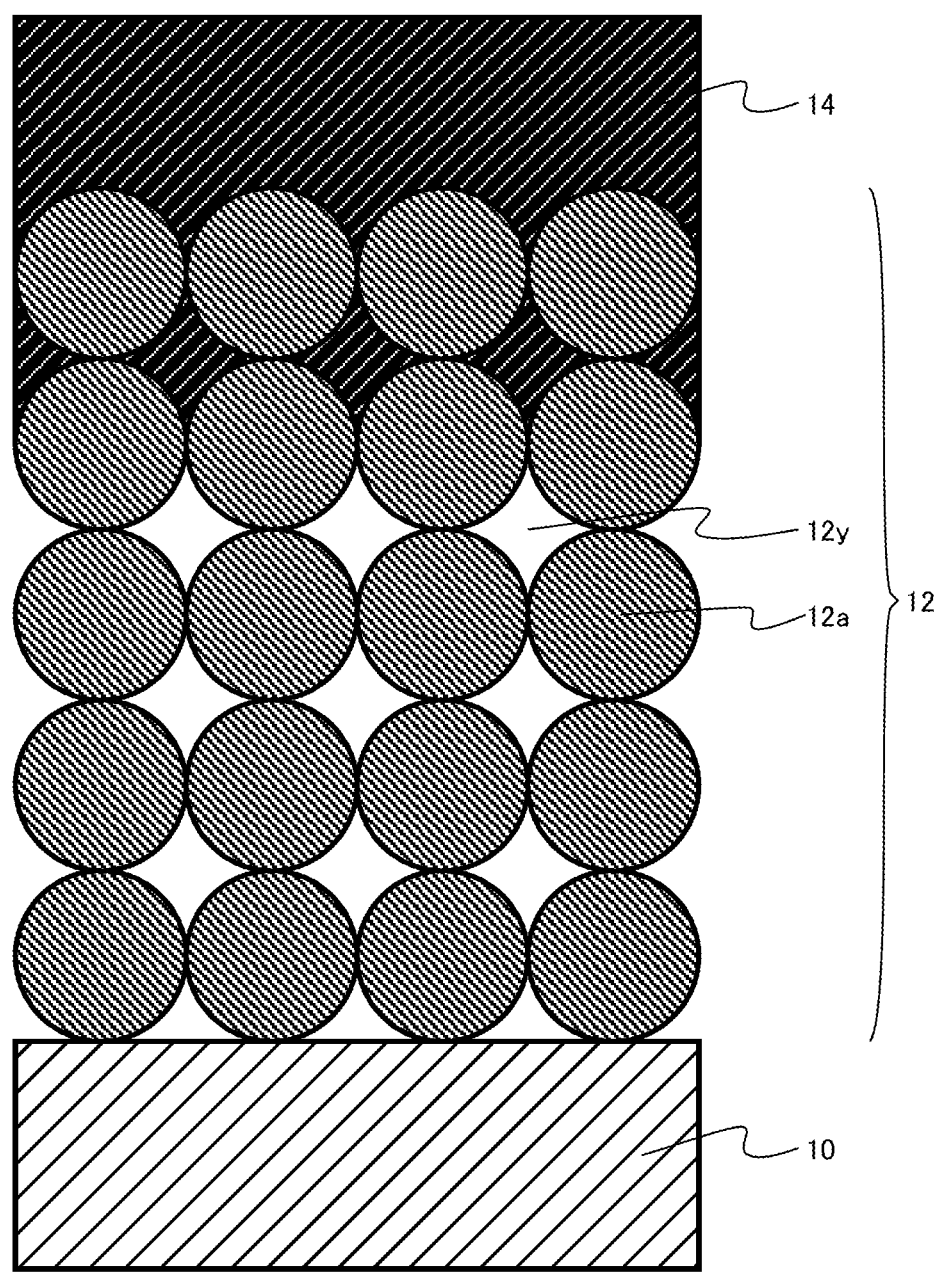
FIG. 6 is a diagram for explaining a method for manufacturing a semiconductor device according to the first embodiment.

FIG. 6 is a diagram for explaining the formation of the protective layer 14. FIG. 6 is an enlarged view of a region R3 surrounded by a dashed line shown in FIG. 5.

As shown in FIG. 6, even after the formation of the protective layer 14, some of the voids 12y inside the particle layer 12 remain, for example.

The surface of the protective layer 14 is then planarized by a chemical mechanical polishing technique (CMP technique), for example.

Figure 7A:
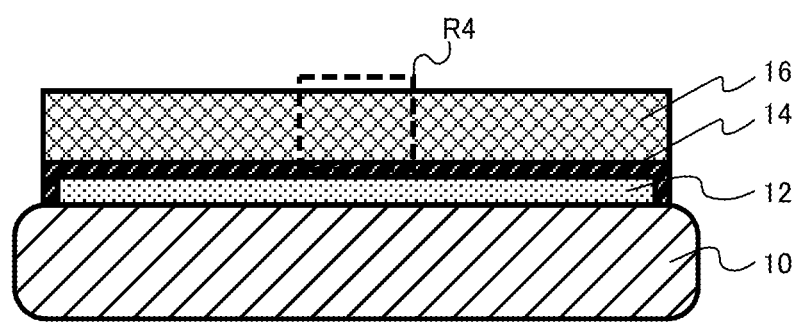
FIGS. 7A and 7B are diagrams for explaining a method for manufacturing a semiconductor device according to the first embodiment.

Next, as shown in FIG. 7A, the memory layer 16 is formed on the protective layer 14. The memory layer 16 is formed by a known process technique.

Figure 7B:
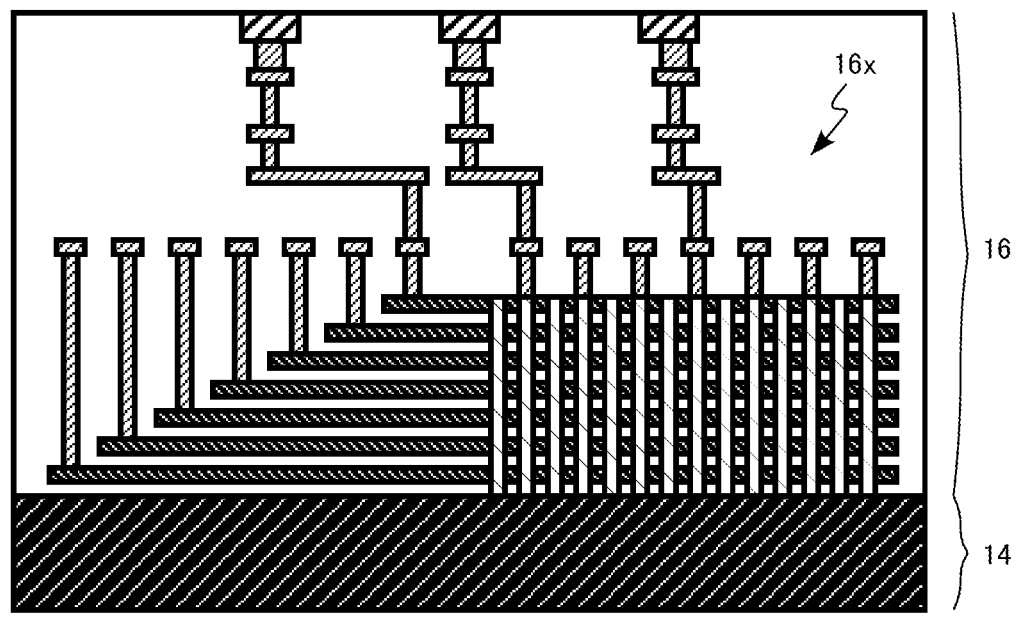

FIG. 7B is an enlarged view of a region R4 surrounded by a dashed line shown in FIG. 7A. As shown in FIG. 7B, the memory layer 16 includes a memory cell array 16x with a plurality of memory cells. The memory cells are disposed three-dimensionally in the memory cell array 16x, for example.

The memory cell array 16x is an example of the electronic circuit. Operations of the memory cell array 16x are controlled by the control circuit 20x of the semiconductor substrate 20, for example.

Figure 8:
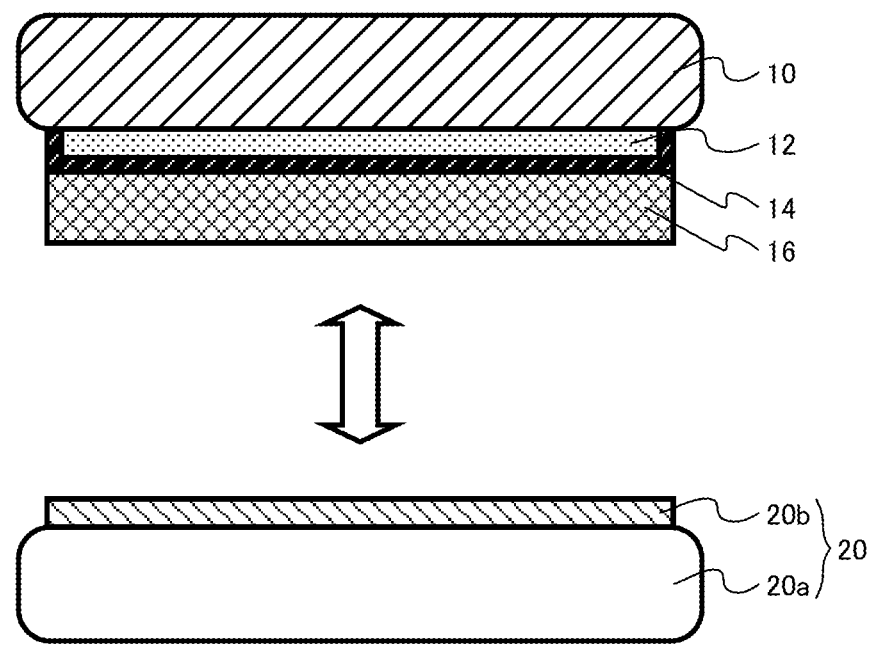
FIG. 8 is a diagram for explaining a method for manufacturing a semiconductor device according to the first embodiment.

Next, as shown in FIG. 8, the wiring layer 20b of the semiconductor substrate 20 and the memory layer 16 are made to face each other.

Figure 9:
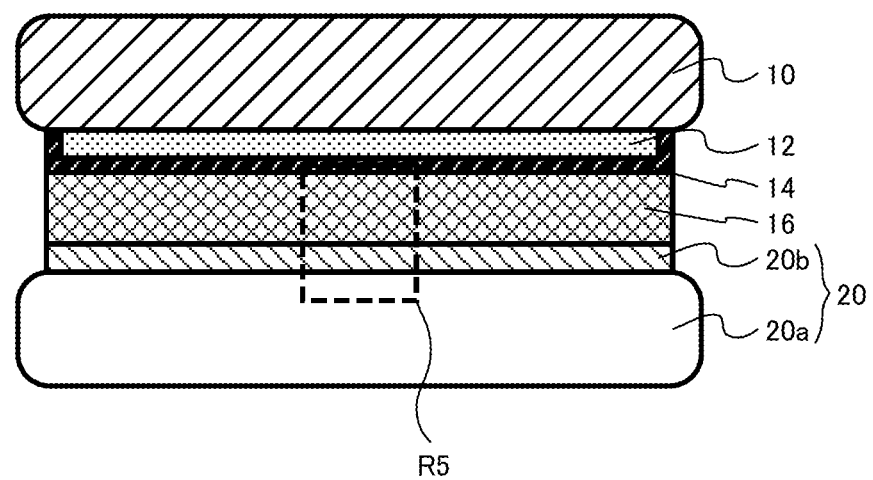
FIG. 9 is a diagram for explaining a method for manufacturing a semiconductor device according to the first embodiment.

Next, as shown in FIG. 9, the semiconductor substrate 20 and the memory layer 16 are bonded to each other. The wiring layer 20b of the semiconductor substrate 20 and the memory layer 16 are brought into contact with each other and are bonded to each other.

For example, mechanical pressure is applied between the support substrate 10 and the semiconductor substrate 20. For example, the wiring layer 20b and the memory layer 16 are subjected to a heat treatment while the mechanical pressure is being applied. Thus, the wiring layer 20b and the memory layer 16 are joined to each other. The temperature of the heat treatment is equal to or higher than 300° C. and equal to or lower than 500° C., for example.

Figure 10:
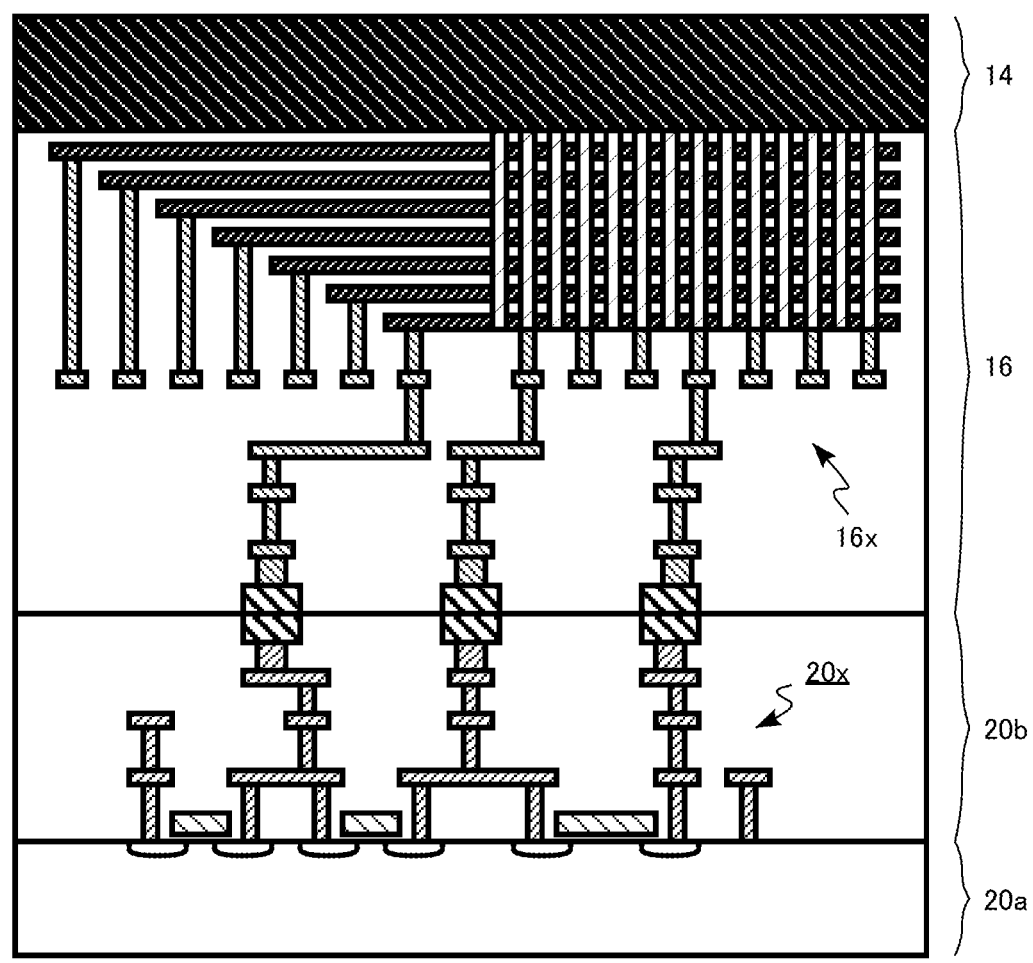
FIG. 10 is a diagram for explaining a method for manufacturing a semiconductor device according to the first embodiment.

FIG. 10 is an enlarged view of a region R5 surrounded by a dashed line shown in FIG. 9. As the wiring layer 20b and the memory layer 16 are joined to each other, the control circuit 20x and the memory cell array 16x are electrically connected. The control circuit 20x has a function to control operations of the memory cell array 16x, for example.

Figure 11:
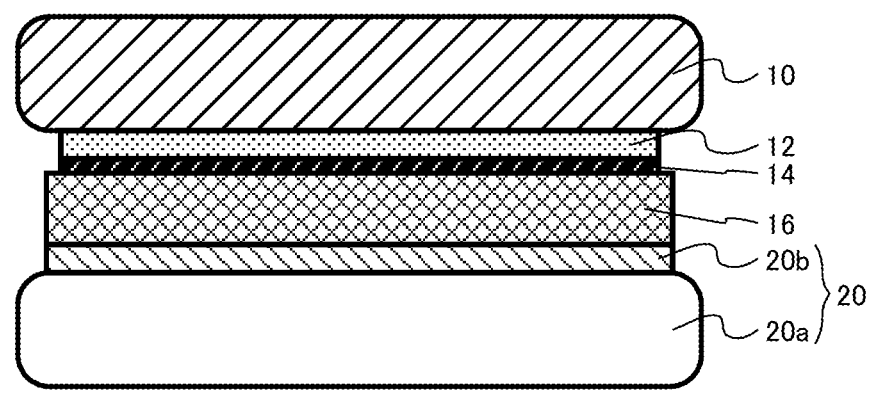
FIG. 11 is a diagram for explaining a method for manufacturing a semiconductor device according to the first embodiment.

Next, as shown in FIG. 11, the portions of the protective layer 14 formed on the side surfaces of the particle layer 12 are removed. As the portions of the protective layer 14 formed on the side surfaces of the particle layer 12 are removed, the side surfaces of the particle layer 12 are exposed. The removal of the protective layer 14 is realized by wet etching, for example.

Note that the portions of the protective layer 14 formed on the side surfaces of the particle layer 12 may be removed before the semiconductor substrate 20 and the memory layer 16 are bonded to each other.

Figure 12:
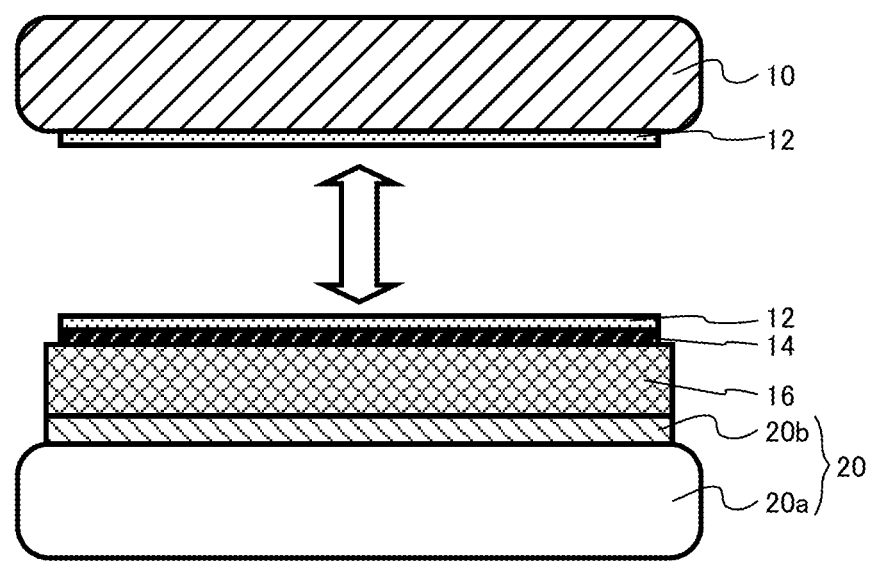
FIG. 12 is a diagram for explaining a method for manufacturing a semiconductor device according to the first embodiment.

Next, as shown in FIG. 12, the support substrate 10 and the semiconductor substrate 20 are separated, with the particle layer 12 serving as the boundary. The support substrate 10 and the semiconductor substrate 20 integrated with the particle layer 12 interposed in between are separated into the support substrate 10 integrated with one part of the particle layer 12 and the semiconductor substrate 20 integrated with another part of the particle layer 12. For example, the particle layer 12 is divided, so that the support substrate 10 and the semiconductor substrate 20 are separated from each other.

Etching is performed on the particle layer 12 by a wet etching technique, for example, so that the support substrate 10 and the semiconductor substrate 20 are separated from each other. For example, etching is performed on the particle layer 12 by wet etching using a solution containing hydrofluoric acid.

Since the voids 12y exist in the particle layer 12, wet etching proceeds more easily than in a dense film formed by a CVD technique or the like, for example. The etching of the particle layer 12 proceeds from the side surfaces of the particle layer 12 from which the protective layer 14 has been removed, for example.

For example, a known laser ablation technique can be used to separate the support substrate 10 and the semiconductor substrate 20, with the particle layer 12 serving as the boundary. For example, the particle layer 12 is irradiated with laser light through the support substrate 10. As the particle layer 12 is destroyed by the laser light irradiation, so that the support substrate 10 and the semiconductor substrate 20 are separated.

In a case where a laser ablation technique is used, the protective layer 14 formed on the side surfaces of the particle layer 12 can be destroyed by laser light. Accordingly, it may be unnecessary to remove the protective layer 14 on the side surfaces of the particle layer 12 in advance.

It is also possible to use a known water jet technique for separating the support substrate 10 and the semiconductor substrate 20, with the particle layer 12 serving as the boundary. For example, the side surfaces of the particle layer 12 are subjected to water jetting, so that the particle layer 12 is destroyed, and the support substrate 10 and the semiconductor substrate 20 are separated.

Figure 13A:
FIGS. 13A and 13B are diagrams for explaining a method for manufacturing a semiconductor device according to the first embodiment.

The separated support substrate 10 is reused, after the remaining particle layer 12 is removed as shown in FIG. 13A. The remaining particle layer 12 is removed by a wet etching technique, for example.

Figure 13B:
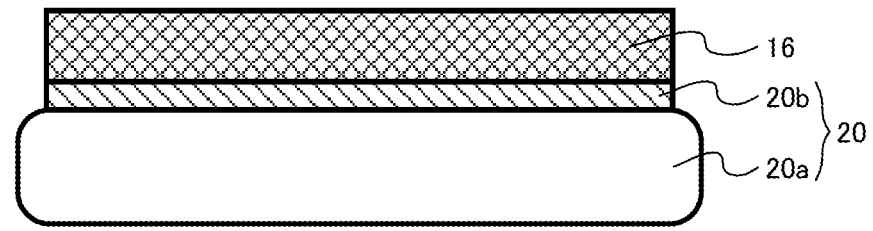

The particle layer 12 and protective layer 14 remaining on the separated semiconductor substrate 20 are removed as shown in FIG. 13B. The remaining particle layer 12 and protective layer 14 are removed by a CMP technique, for example.

After that, the semiconductor substrate 20 and the memory layer 16 are divided into a plurality of semiconductor memory chips by a blade dicing technique, for example.

Next, the functions and the effects of the method for manufacturing a semiconductor device according to the first embodiment are described.

By a bonding technique, a support substrate on which an electronic circuit is formed and a semiconductor substrate on which another electronic circuit is formed are bonded to each other, so that a highly functional or highly integrated semiconductor device is obtained. For example, a support substrate on which a memory cell array is formed and a semiconductor substrate on which a control circuit for controlling the memory cell array is formed are bonded to each other. The unnecessary portions of the support substrate are then removed. The support substrate is ground from its back surface, for example, so that the unnecessary portions of the support substrate are removed. After that, the resultant structure including the semiconductor substrate is divided into a plurality of chips by dicing, so that a highly functional or highly integrated semiconductor memory can be obtained.

As the unnecessary portions of the support substrate are removed prior to the dicing, a new support substrate is required for manufacturing a new semiconductor device. Because of this, the manufacturing costs of a semiconductor device become higher.

By the method for manufacturing a semiconductor device according to the first embodiment, on the other hand, the support substrate 10 and the semiconductor substrate 20 are separated, with the particle layer 12 serving as the boundary. The particle layer 12 remaining on the support substrate 10 is removed, for example, so that the separated support substrate 10 can be used again as the support substrate 10. Thus, the manufacturing costs of a semiconductor device can be lowered.

For example, to reuse the support substrate, a porous silicon region may be formed on the support substrate by anodization, and the support substrate and the semiconductor substrate may be separated, with the formed silicon region serving as the boundary. In the case of this method, to form the porous silicon region, it is necessary to introduce a new manufacturing device such as an anodizer into the manufacturing line, for example. Also, in the case of this method, a long period of time is required for forming a thick porous silicon region by anodization. Therefore, there is a possibility that the manufacturing costs will increase.

By the method for manufacturing a semiconductor device according to the first embodiment, on the other hand, a particle dispersion in which the silicon oxide particles 12a are dispersed is applied, so that the particle layer 12 is formed. As the particle layer 12 can be formed by a coating technique, an existing coating device can be used, for example. Thus, introduction of a new manufacturing apparatus into the manufacturing line may become unnecessary.

As the particle layer 12 is formed by coating, the layer can also be made thicker in a relatively short time.

Also, to reuse the support substrate, a deposited layer may be formed on the support substrate by a vapor phase growth technique, for example, and the support substrate and the semiconductor substrate may be separated, with the formed deposited layer serving as the boundary. In the case of this method, the stress from the deposited layer might deform the support substrate and the semiconductor substrate, and cause a problem in the formation of an electronic circuit. Since the density of the deposited layer is high in the case of this method, it might take a long time to remove or destroy the deposited layer.

By the method for manufacturing a semiconductor device according to the first embodiment, on the other hand, the particle layer 12 is a porous layer in which the voids 12y are formed between the silicon oxide particles 12a. Accordingly, the stress is smaller than that of the high-density deposited layer. Because of this, the support substrate and the semiconductor substrate are less likely to be deformed, compared with the high-density deposited layer. Further, since the particle layer 12 is a porous layer, the time required for removal or destruction is shorter than that with the high-density deposited layer.

Also, to reuse the support substrate, a resin layer may be formed on the support substrate, for example, and the support substrate and the semiconductor substrate may be separated, with the formed resin layer serving as the boundary. In the case of this method, it is difficult to form an electronic circuit that requires a heat treatment at 800° C. or higher, for example, on the resin layer.

By the method for manufacturing a semiconductor device according to the first embodiment, the particle layer 12 is formed with the silicon oxide particles 12a. Accordingly, the particle layer 12 has a higher heat resistance than that of the resin layer. Thus, an electronic circuit that requires a heat treatment at 800° C. or higher can be formed on the particle layer 12, for example.

By the method for manufacturing a semiconductor device according to the first embodiment, it is easy to adjust the particle size of the silicon oxide particles 12a, the thickness of the particle layer 12, the temperature of the heat treatment to be applied to the particle layer 12, the atmosphere during the heat treatment, the duration of the heat treatment, and the like, for example. The particle size of the silicon oxide particles 12a, the thickness of the particle layer 12, the temperature of the heat treatment to be applied to the particle layer 12, the atmosphere during the heat treatment, the duration of the heat treatment, and the like are adjusted, for example, so that the characteristics of the particle layer 12 can be adjusted. Thus, it is possible to easily adjust the characteristics of the particle layer 12 by adjusting the particle size of the silicon oxide particles 12a, the thickness of the particle layer 12, the temperature of the heat treatment to be applied to the particle layer 12, the atmosphere during the heat treatment, the duration of the heat treatment, and the like.

Specifically, it becomes easier to adjust the bonding strength between the support substrate 10 and the semiconductor substrate 20 with the particle layer 12, and adjust the etching characteristics of the particle layer 12 or the fracture characteristics of the particle layer 12. Thus, a method for manufacturing a semiconductor device using a bonding technique can be easily optimized.

The thickness of the particle layer 12 after the first heat treatment is preferably equal to or more than 0.5 μm and equal to or less than 10 μm, or more preferably, equal to or more than 1 µm and equal to or less than 5 µm. As the thickness of the particle layer 12 exceeds the above lower limit value, the support substrate 10 and the semiconductor substrate 20 can be easily separated. Also, as the thickness exceeds the above lower limit value, the stress from the particle layer 12 becomes smaller. Further, as the thickness does not exceed the above upper limit value, the bonding strength between the support substrate 10 and the semiconductor substrate 20 becomes higher.

The median particle size of the silicon oxide particles 12a is preferably equal to or more than 10 nm and equal to or less than 500 nm, or more preferably, equal to or more than 50 nm and equal to or less than 200 nm. As the median particle size exceeds the above lower limit value, the density of the silicon oxide particles 12a in the particle layer 12 becomes lower. Accordingly, the density of the contact portions between the silicon oxide particles 12a becomes lower, and the support substrate 10 and the semiconductor substrate 20 can be easily separated. Also, as the median particle size does not exceed the above upper limit value, the density of the silicon oxide particles 12a in the particle layer 12 becomes higher. Accordingly, the density of the contact portions between the silicon oxide particles 12a becomes higher, and the bonding strength between the support substrate 10 and the semiconductor substrate 20 becomes higher.

The temperature of the first heat treatment is preferably 800° C. or higher, or more preferably, 900° C. or higher, or even more preferably, 1000° C. or higher, for example. As the temperature exceeds the above lower limit value, it is possible to reduce fluctuations in the characteristics of the particle layer 12 due to the heat treatment at the time of the formation of the memory cell array 16x in the memory layer 16. Further, the bonding strength between the support substrate 10 and the semiconductor substrate 20 is increased.

To form the protective layer 14, it is preferable to use a P-CVD technique. Compared with a low-pressure chemical vapor deposition technique (LPCVD technique), for example, a P-CVD technique reduces intrusion of a raw material gas into the particle layer 12. Thus, the voids 12y in the particle layer 12 can be prevented from being filled with the protective layer 14.

The surface of the protective layer 14 is preferably planarized before the memory layer 16 is formed on the protective layer 14. Thus, the memory cell array 16x can be easily formed.

As described above, according to the method for manufacturing a semiconductor device according to the first embodiment, it is possible to reuse the support substrate in the manufacturing of a semiconductor device using a bonding technique.

Second Embodiment

A method for manufacturing a semiconductor device according to a second embodiment differs from the method for manufacturing a semiconductor device according to the first embodiment in that the first substrate includes a silicon oxide film provided on its surface. In the description below, explanation of some of the aspects that are the same as the method for manufacturing a semiconductor device according to the first embodiment will not be repeated.

Figure 14:
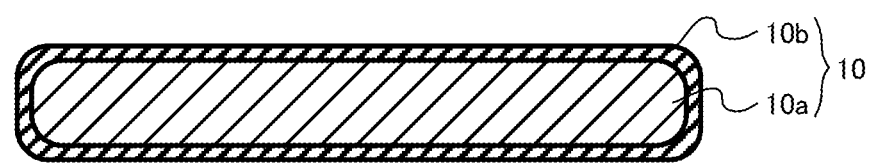
FIG. 14 is a diagram for explaining a method for manufacturing a semiconductor device according to a second embodiment.

FIG. 14 is a diagram for explaining the method for manufacturing a semiconductor device according to the second embodiment. FIG. 14 is a schematic cross-sectional view of the support substrate.

The support substrate 10 includes a semiconductor layer 10a and a silicon oxide film 10b.

The semiconductor layer 10a is a silicon layer, for example. The silicon layer is single-crystal silicon, for example.

The silicon oxide film 10b is provided on a surface of the support substrate 10. The silicon oxide film 10b is provided on the semiconductor layer 10a. The silicon oxide film 10b is formed by thermal oxidation, for example. The thickness of the silicon oxide film 10b is equal to or more than 10 nm and equal to or less than 100 nm, for example.

The support substrate 10 is a silicon wafer having the silicon oxide film 10b formed on its surface, for example.

As the support substrate 10 includes the silicon oxide film 10b, the adhesion between the support substrate 10 and the particle layer 12 is enhanced. Thus, the bonding strength between the support substrate 10 and the semiconductor substrate 20 is increased.

As described above, according to the method for manufacturing a semiconductor device according to the second embodiment, it is possible to reuse the support substrate in the manufacturing of a semiconductor device using a bonding technique, as in the first embodiment.

Third Embodiment

A method for manufacturing a semiconductor device according to a third embodiment differs from the method for manufacturing a semiconductor device according to the first embodiment in that, before the second layer is formed, a region that is in contact with at least some of the silicon oxide particles and the first substrate, and includes a second insulator is formed in the first layer. In the description below, explanation of some of the aspects that are the same as the method for manufacturing a semiconductor device according to the first embodiment will not be repeated.

Figure 15:
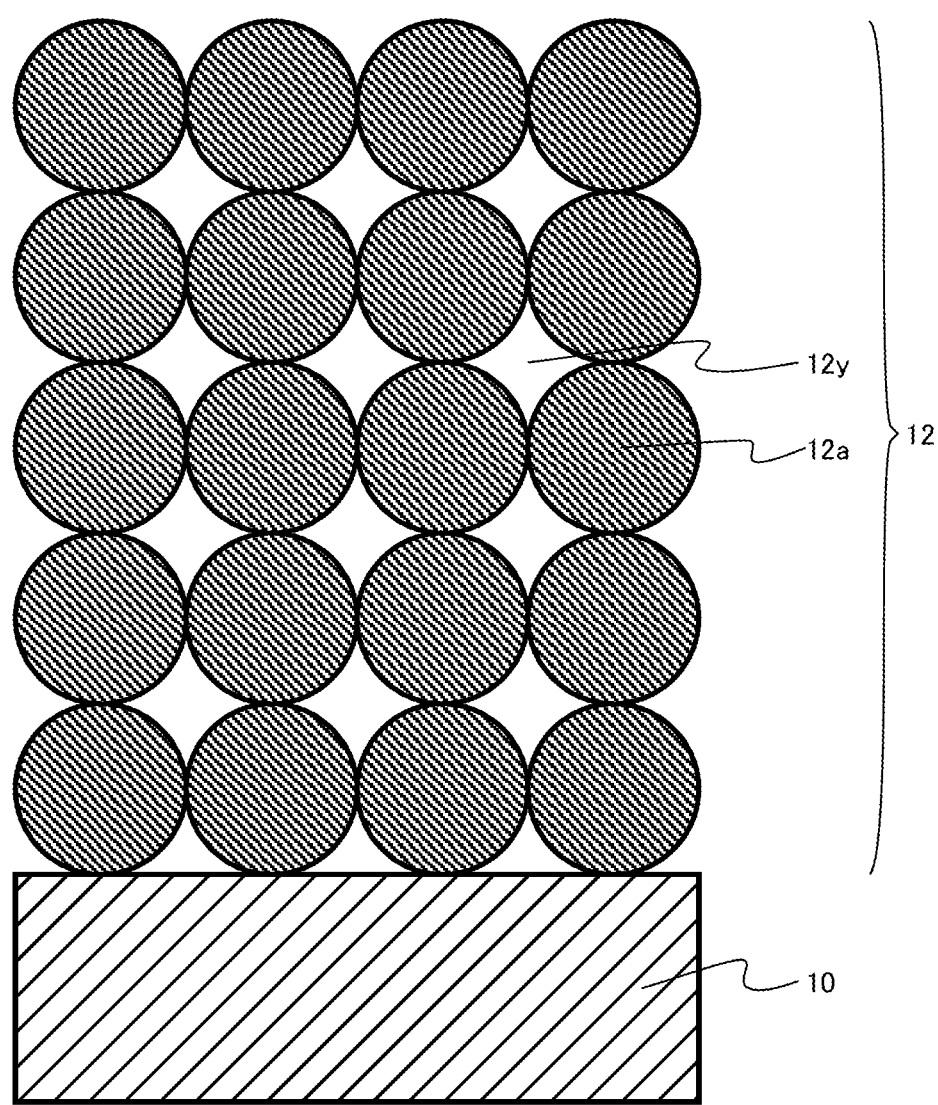
FIG. 15 is a diagram for explaining a method for manufacturing a semiconductor device according to a third embodiment.
Figure 16:
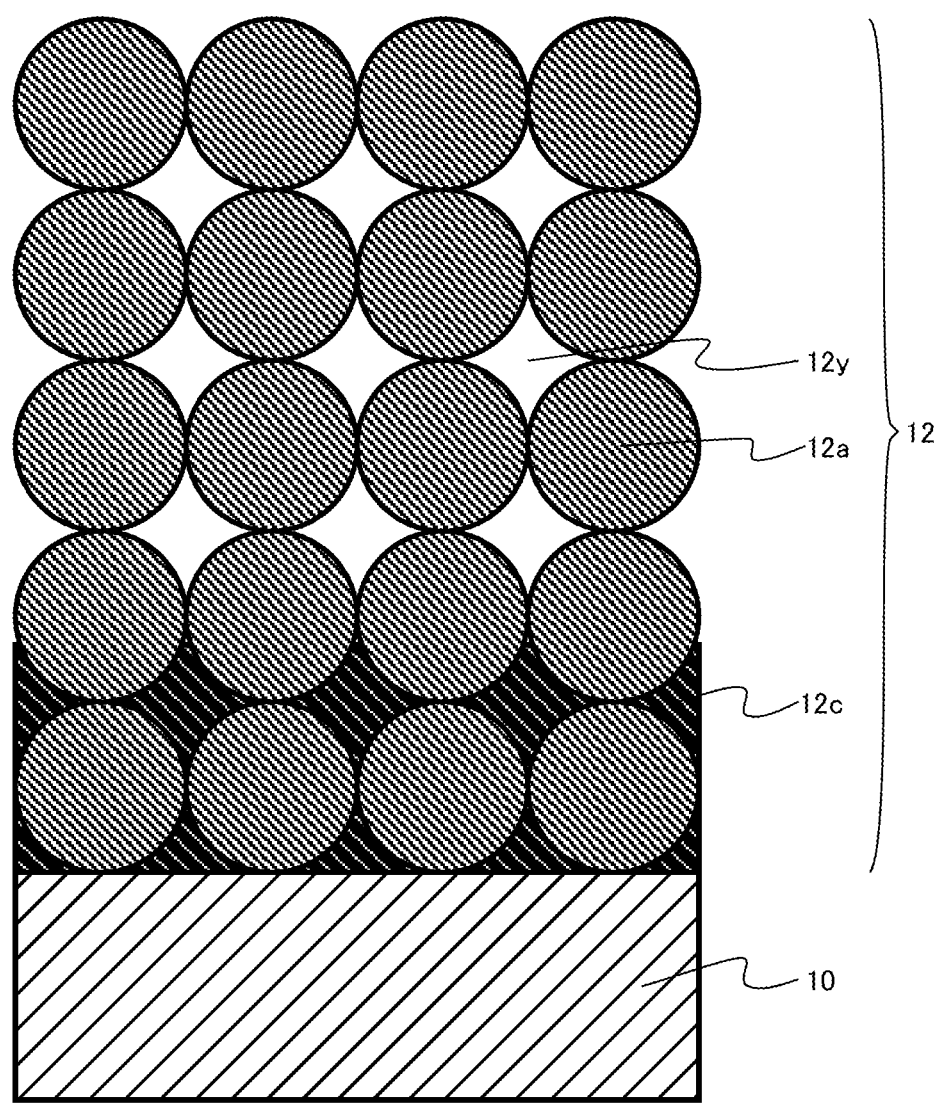
FIG. 16 is a diagram for explaining a method for manufacturing a semiconductor device according to the third embodiment.
Figure 17:
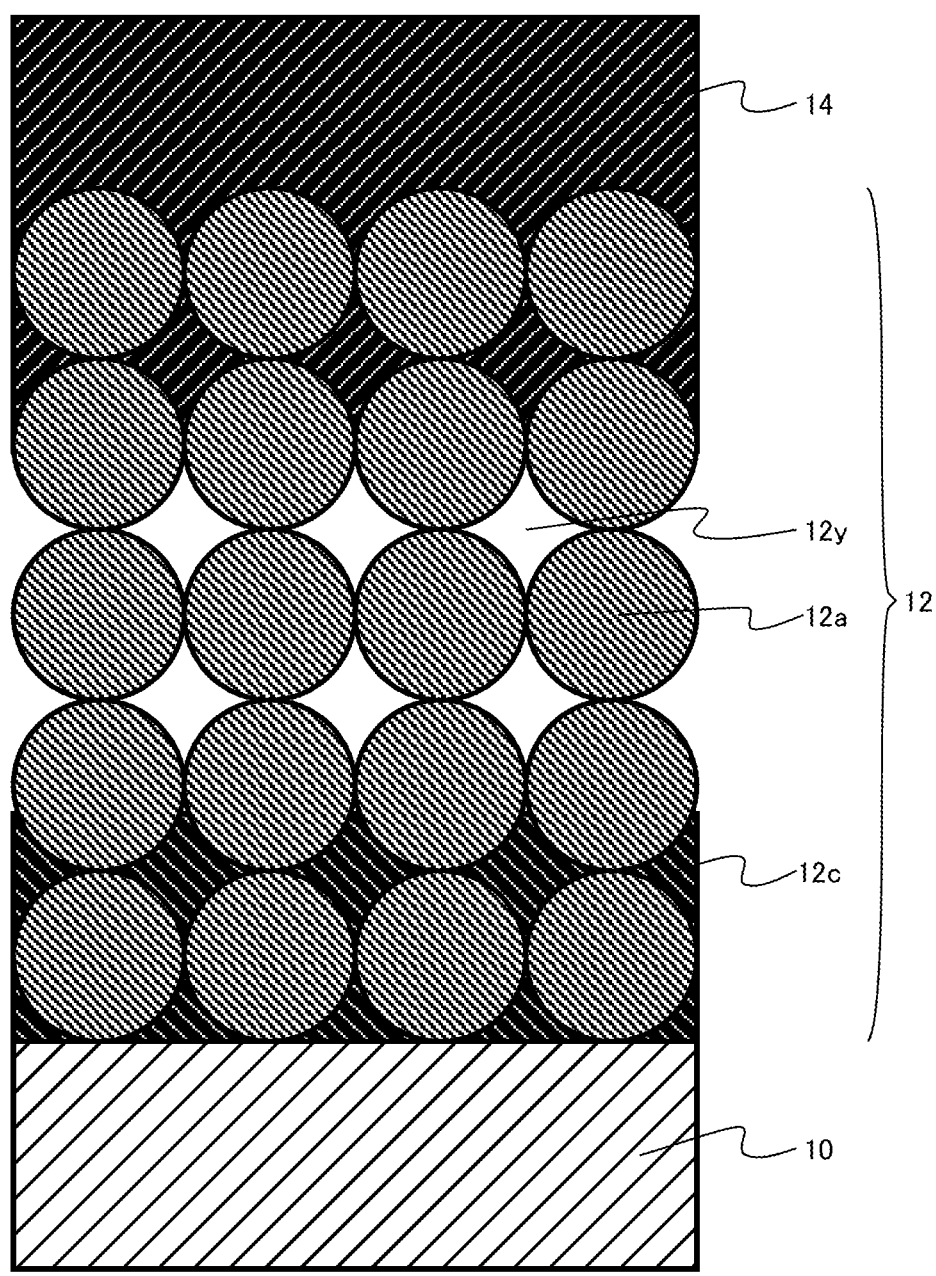
FIG. 17 is a diagram for explaining a method for manufacturing a semiconductor device according to the third embodiment.

FIGS. 15, 16, and 17 are diagrams for explaining the method for manufacturing a semiconductor device according to the third embodiment. FIGS. 15, 16, and 17 are diagrams for explaining the formation of the particle layer and the protective layer.

A particle dispersion containing the silicon oxide particles 12a is applied onto the support substrate 10, to form the particle layer 12, as in the method for manufacturing a semiconductor device according to the first embodiment. Specifically, a particle dispersion in which the silicon oxide particles 12a are dispersed is applied onto the support substrate 10. Next, a baking treatment is performed. As shown in FIG. 15, at least part of the dispersion medium 12x is removed by the baking treatment. By the baking treatment, the voids 12y are formed.

An adhesive region 12c is then formed in the particle layer 12. The adhesive region 12c is an example of the region.

The adhesive region 12c is formed in a lower portion of the particle layer 12. The adhesive region 12c is in contact with at least some of the silicon oxide particles 12a. The adhesive region 12c is also in contact with the support substrate 10.

The adhesive region 12c includes a second insulator. The second insulator is a silicon oxide, a silicon nitride, or a silicon oxynitride, for example.

The adhesive region 12c is formed by a spin-on-dielectric technique (SOD technique), for example. In a case where the second insulator is a silicon oxide, siloxane is applied onto the particle layer 12 after the baking treatment on the particle layer 12, for example. The applied siloxane accumulates in the lower portion of the particle layer 12 because of gravity, for example, and thus, the adhesive region 12c is formed. After the formation of the adhesive region 12c, a baking treatment is performed, for example.

Alternatively, a particle dispersion containing the silicon oxide particles 12a and siloxane may be applied when the particle layer 12 is formed, for example, so that the adhesive region 12c is formed.

Next, a first heat treatment is performed. The particle layer 12 is solidified by the first heat treatment. As shown in FIG. 16, the dispersion medium 12x is removed by the baking treatment and the first heat treatment, and the particle layer 12 is solidified. The adhesive region 12c in the particle layer 12 is also solidified.

Next, as shown in FIG. 17, the protective layer 14 is formed on the upper surface and the side surfaces (not shown) of the particle layer 12. The voids 12y remain between the adhesive region 12c and the protective layer 14.

As the adhesive region 12c is formed in the lower portion of the particle layer 12, the adhesion between the support substrate 10 and the particle layer 12 is enhanced. Thus, the bonding strength between the support substrate 10 and the semiconductor substrate 20 is increased.

As described above, according to the method for manufacturing a semiconductor device according to the third embodiment, it is possible to reuse the support substrate in the manufacturing of a semiconductor device using a bonding technique, as in the first embodiment.

Fourth Embodiment

A method for manufacturing a semiconductor device according to a fourth embodiment differs from the method for manufacturing a semiconductor device according to the first embodiment in that the atmosphere of the first heat treatment is an oxidizing atmosphere. In the description below, explanation of some of the aspects that are the same as the method for manufacturing a semiconductor device according to the first embodiment will not be repeated.

By the method for manufacturing a semiconductor device according to the fourth embodiment, the first heat treatment is performed in an oxidizing atmosphere. The first heat treatment is performed in an atmosphere containing an oxygen gas or water vapor, for example.

As the first heat treatment performed in an oxidizing atmosphere, the bonds between the silicon oxide particles 12a are strengthened. Thus, the bonding strength between the support substrate 10 and the semiconductor substrate 20 is increased.

As described above, according to the method for manufacturing a semiconductor device according to the fourth embodiment, it is possible to reuse the support substrate in the manufacturing of a semiconductor device using a bonding technique, as in the first embodiment.

Fifth Embodiment

A method for manufacturing a semiconductor device according to a fifth embodiment differs from the method for manufacturing a semiconductor device according to the first embodiment in that a treatment in an atmosphere containing an organosilicon compound is performed after the first heat treatment and before the formation of the second layer. In the description below, explanation of some of the aspects that are the same as the method for manufacturing a semiconductor device according to the first embodiment will not be repeated.

By the method for manufacturing a semiconductor device according to the fifth embodiment, a treatment in an atmosphere containing an organosilicon compound is performed on the particle layer 12 after the first heat treatment and before the formation of the protective layer 14. For example, the organosilicon compound is tetramethylcyclotetrasiloxane (TMCTS), for example.

A second heat treatment is performed after the treatment in an atmosphere containing an organosilicon compound. By the second heat treatment, the carbon derived from the TMCTS is removed from the particle layer 12, for example.

The temperature of the second heat treatment is equal to or higher than 800° C. and equal to or lower than 1200° C., for example. The second heat treatment is performed in a non-oxidizing atmosphere, for example. The second heat treatment is performed in a nitrogen atmosphere, for example.

As the treatment in an atmosphere containing an organosilicon compound is performed, the bonds between the silicon oxide particles 12a are strengthened. Thus, the bonding strength between the support substrate 10 and the semiconductor substrate 20 is increased.

As described above, according to the method for manufacturing a semiconductor device according to the fifth embodiment, it is possible to reuse the support substrate in the manufacturing of a semiconductor device using a bonding technique, as in the first embodiment.

Sixth Embodiment

A method for manufacturing a semiconductor device according to a sixth embodiment differs from the method for manufacturing a semiconductor device of the first embodiment in that the particle size distribution of the silicon oxide particles includes a bimodal distribution. In the description below, explanation of some of the aspects that are the same as the method for manufacturing a semiconductor device according to the first embodiment will not be repeated.

Figure 18:
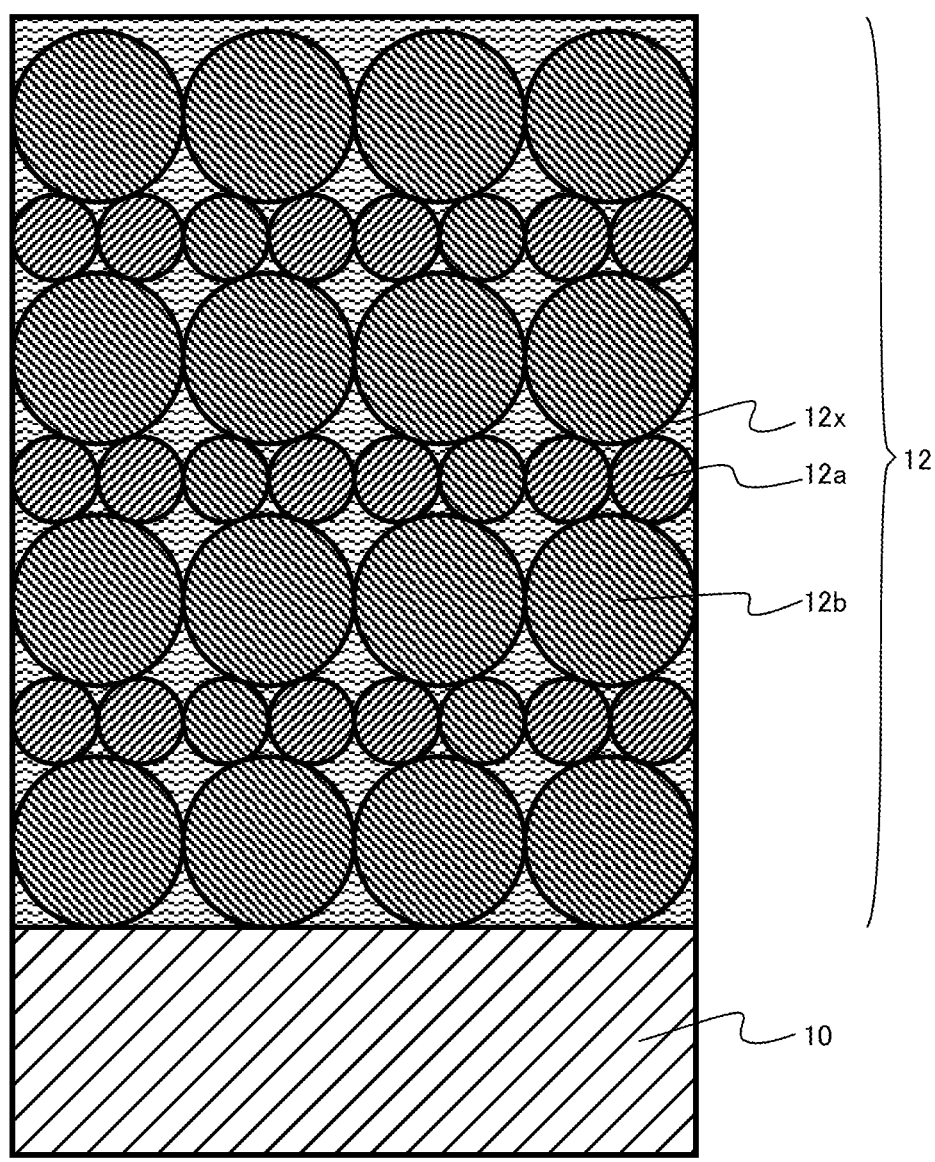
FIG. 18 is a diagram for explaining a method for manufacturing a semiconductor device according to a sixth embodiment.
Figure 19:
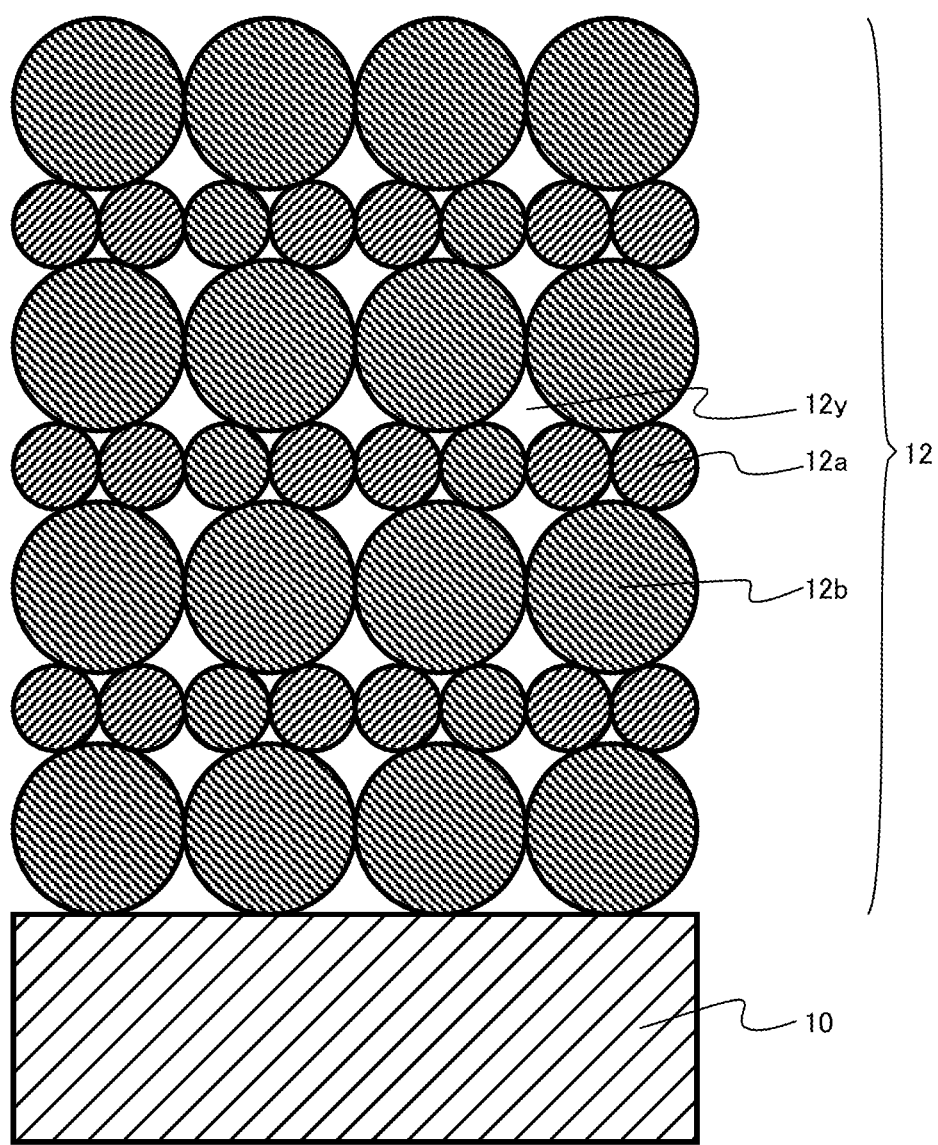
FIG. 19 is a diagram for explaining a method for manufacturing a semiconductor device according to the sixth embodiment.
Figure 20:
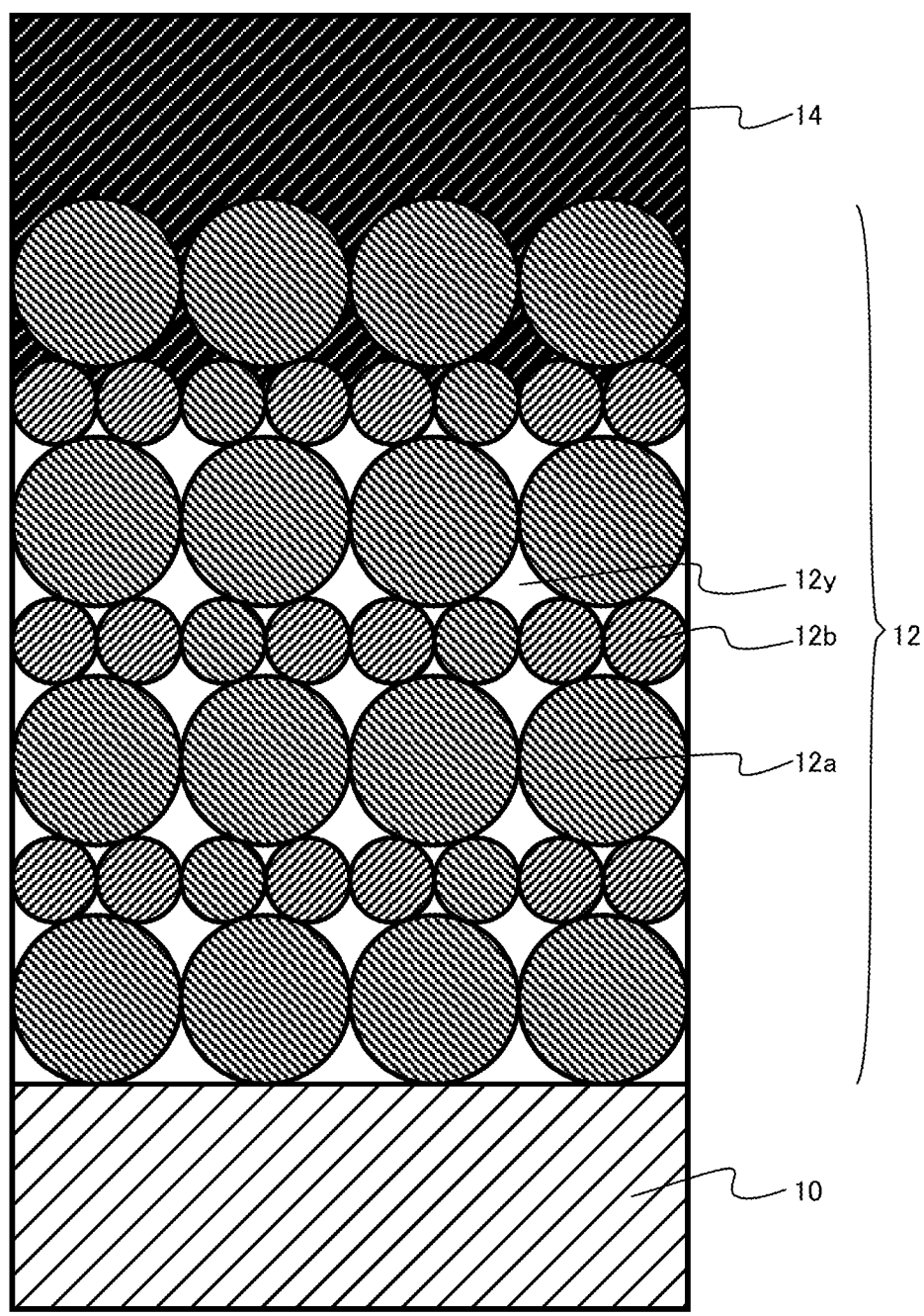
FIG. 20 is a diagram for explaining a method for manufacturing a semiconductor device according to the sixth embodiment.

FIGS. 18, 19, and 20 are diagrams for explaining the method for manufacturing a semiconductor device according to the sixth embodiment. FIGS. 18, 19, and 20 are diagrams for explaining the formation of the particle layer and the protective layer.

As shown in FIG. 18, a particle dispersion in which silicon oxide particles 12a and silicon oxide particles 12b are dispersed in a dispersion medium 12x is applied onto the support substrate 10.

The particle size of the silicon oxide particles 12b is larger than the particle size of the silicon oxide particles 12a. The particle size distribution of the silicon oxide particles contained in the particle layer 12 includes a bimodal distribution. The particle size distribution of the silicon oxide particles may be a multimodal distribution.

The particle size of the silicon oxide particles 12a is equal to or more than 10 nm and less than 50 nm, for example. The particle size of the silicon oxide particles 12b is equal to or more than 50 nm and equal to or less than 500 nm, for example.

Next, a baking treatment is performed. The baking treatment removes at least part of the dispersion medium 12x.

Next, a first heat treatment is performed. The particle layer 12 is solidified by the first heat treatment. As shown in FIG. 19, the dispersion medium 12x is removed by the baking treatment and the first heat treatment, and the particle layer 12 is solidified.

Through the first heat treatment, the silicon oxide particles are bound to one another. Voids 12y are formed between the silicon oxide particles. The particle layer 12 turns into a porous layer. Some of the voids 12y may be formed by the baking treatment Next, as shown in FIG. 20, the protective layer 14 is formed on the upper surface and the side surfaces (not shown) of the particle layer 12. As shown in FIG. 20, even after the formation of the protective layer 14, some of the voids 12y inside the particle layer 12 remain, for example.

As the particle size distribution of the silicon oxide particles contained in the particle layer 12 includes a bimodal distribution, the density of the silicon oxide particles in the particle layer 12 can be increased. Accordingly, the density of the contact portions between the silicon oxide particles can be increased. Thus, the bonding strength between the support substrate 10 and the semiconductor substrate 20 is increased.

As described above, according to the method for manufacturing a semiconductor device according to the sixth embodiment, it is possible to reuse the support substrate in the manufacturing of a semiconductor device using a bonding technique, as in the first embodiment.

Seventh Embodiment

A method for manufacturing a semiconductor device according to a seventh embodiment differs from the method for manufacturing a semiconductor device according to the first embodiment in that the silicon oxide particles include first silicon oxide particles having a first particle size and second silicon oxide particles having a second particle size, the liquid includes a first liquid containing the first silicon oxide particles and a second liquid containing the second silicon oxide particles, and the formation of the first layer includes application of the first liquid followed by application of the second liquid. In the description below, explanation of some of the aspects that are the same as the method for manufacturing a semiconductor device according to the first embodiment will not be repeated.

FIGS. 21, 22, 23, and 24 are diagrams for explaining the method for manufacturing a semiconductor device according to the seventh embodiment. FIGS. 21, 22, 23, and 24 are diagrams for explaining the formation of the particle layer and the protective layer.

Figure 21:
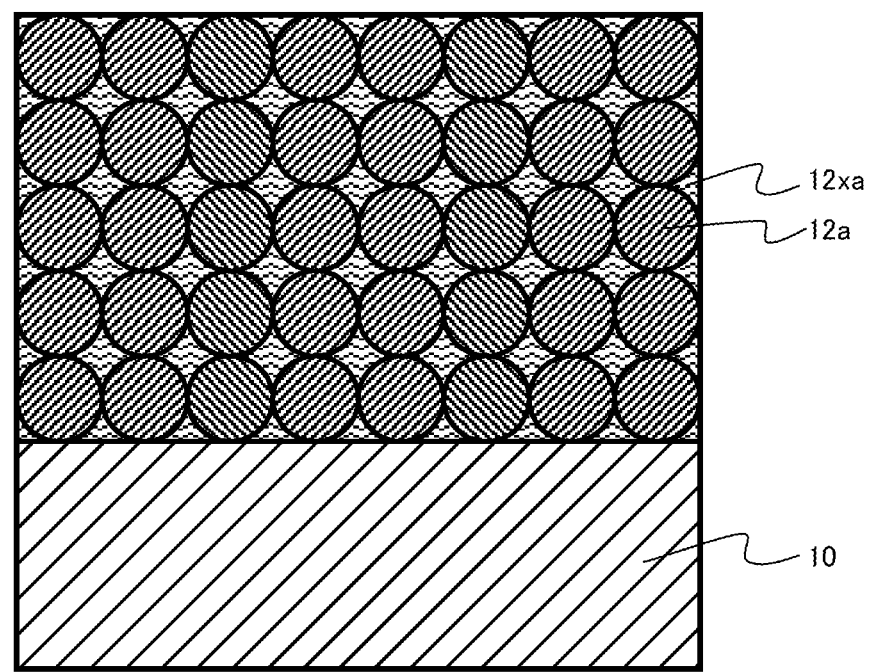
FIG. 21 is a diagram for explaining a method for manufacturing a semiconductor device according to a seventh embodiment.

As shown in FIG. 21, a particle dispersion in which the silicon oxide particles 12a are dispersed in a dispersion medium 12xa is applied onto the support substrate 10. The silicon oxide particles 12a are an example of the first particles. The particle dispersion in which the silicon oxide particles 12a are dispersed in the dispersion medium 12xa is an example of the first liquid.

A first baking treatment is then performed. At least part of the dispersion medium 12xa is removed by the first baking treatment.

Figure 22:
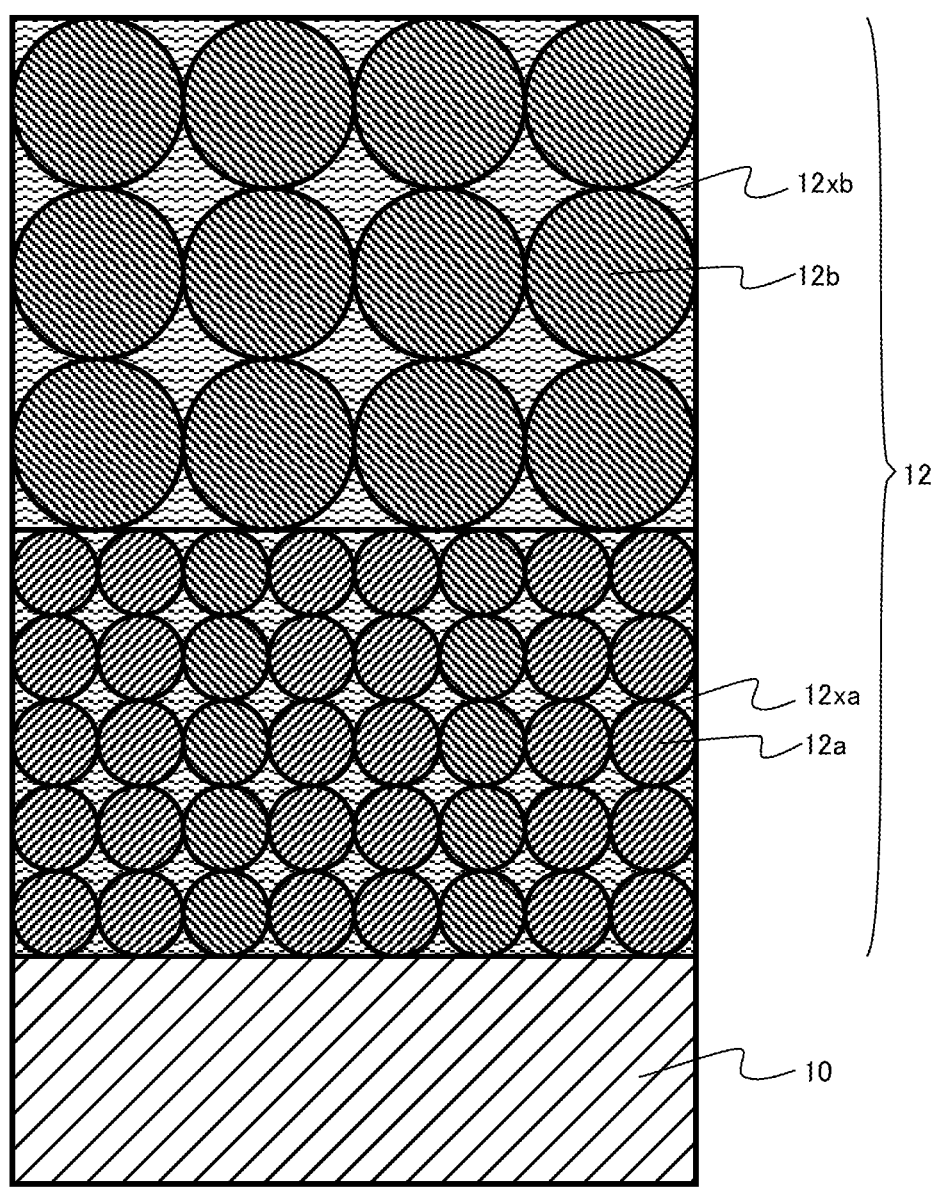
FIG. 22 is a diagram for explaining a method for manufacturing a semiconductor device according to the seventh embodiment.

Next, as shown in FIG. 22, a particle dispersion in which the silicon oxide particles 12b are dispersed in a dispersion medium 12xb is applied onto the silicon oxide particles 12a and the dispersion medium 12xa. The silicon oxide particles 12b are an example of the second particles. The particle dispersion in which the silicon oxide particles 12b are dispersed in the dispersion medium 12xb is an example of the second liquid.

The second particle size of the silicon oxide particles 12b is larger than the first particle size of the silicon oxide particles 12a. The particle size distribution of the silicon oxide particles contained in the particle layer 12 includes a bimodal distribution.

The first particle size of the silicon oxide particles 12a is equal to or more than 10 nm and less than 50 nm, for example. The second particle size of the silicon oxide particles 12b is equal to or more than 50 nm and equal to or less than 500 nm, for example.

A second baking treatment is then performed. The baking treatment removes at least part of the dispersion medium 12xb.

Figure 23:
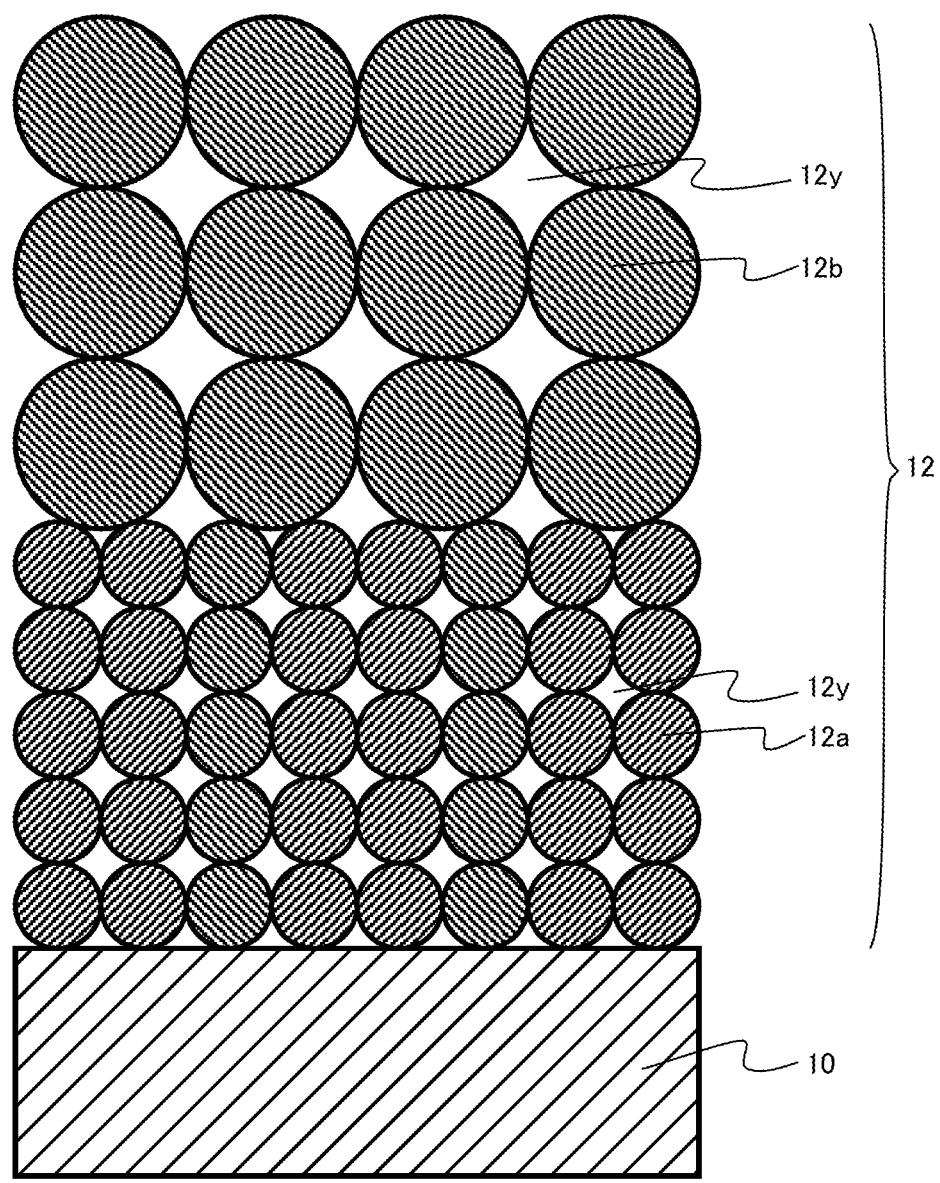
FIG. 23 is a diagram for explaining a method for manufacturing a semiconductor device according to the seventh embodiment.

Next, a first heat treatment is performed. The particle layer 12 is solidified by the first heat treatment. As shown in FIG. 23, the dispersion medium 12xa and the dispersion medium 12xb are removed by the baking treatment and the first heat treatment, and the particle layer 12 is solidified.

Figure 24:
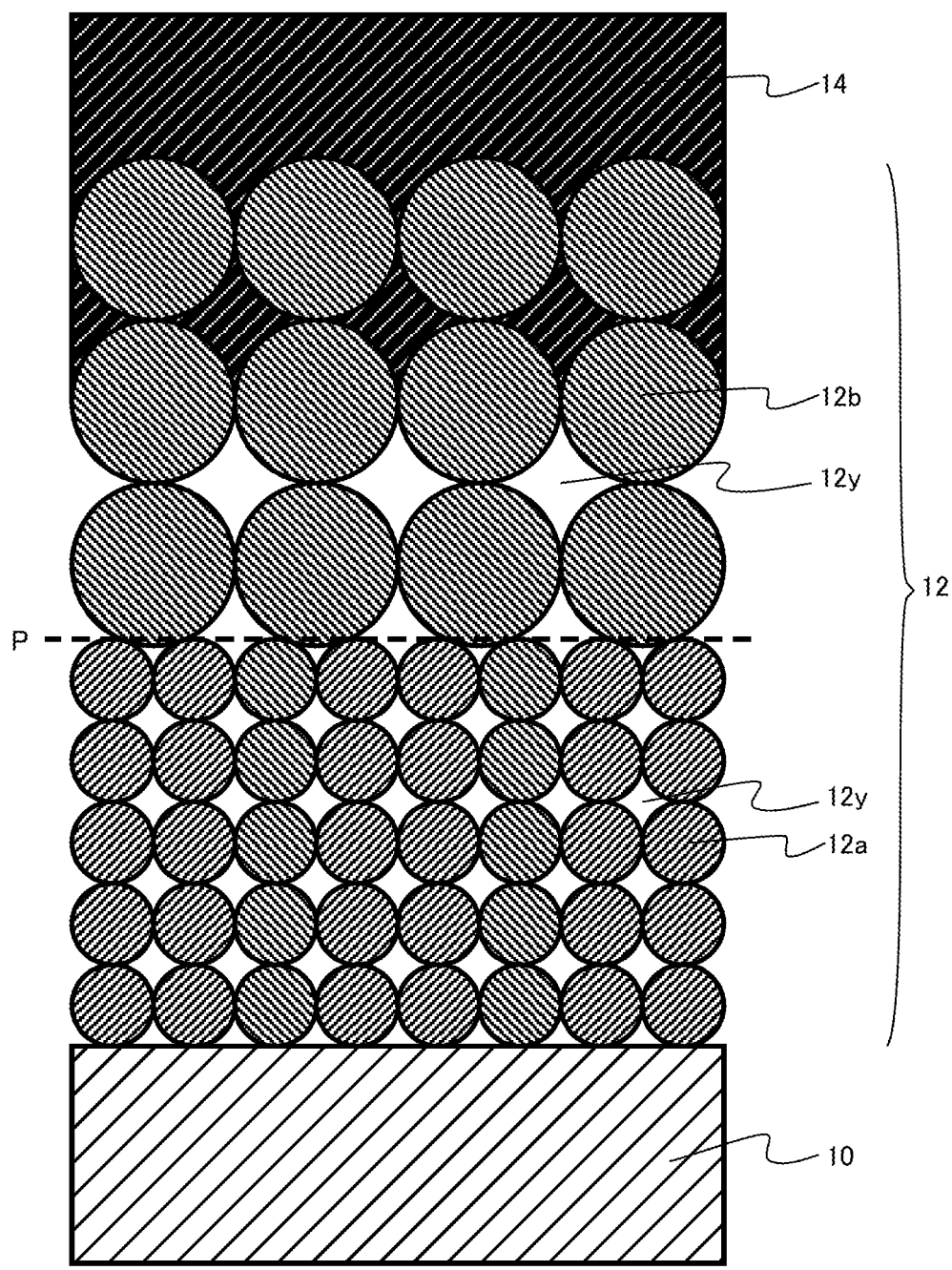
FIG. 24 is a diagram for explaining a method for manufacturing a semiconductor device according to the seventh embodiment.

Through the first heat treatment, the silicon oxide particles are bound to one another. A void 12y is formed between a silicon oxide particle and a silicon oxide particle. The particle layer 12 turns into a porous layer. Some of the voids 12y may be formed by the baking treatment Next, as shown in FIG. 24, the protective layer 14 is formed on the upper surface and the side surfaces (not shown) of the particle layer 12. As shown in FIG. 24, even after the formation of the protective layer 14, some of the voids 12y inside the particle layer 12 remain, for example.

The particle size distribution of the silicon oxide particles contained in the particle layer 12 includes a bimodal distribution. The silicon oxide particles 12a having the smaller particle size are present in a lower portion of the particle layer 12, and the silicon oxide particles 12b having the larger particle size are present in an upper portion of the particle layer 12.

In the particle layer 12, there exists a boundary plane (P in FIG. 24) in which the particle size of the silicon oxide particles changes. The mechanical strength of the boundary plane P is lower than that in the other portions of the particle layer 12. Accordingly, when the support substrate 10 and the semiconductor substrate 20 are separated, the particle layer 12 is easily divided at the boundary plane P. Thus, the support substrate 10 and the semiconductor substrate 20 can be easily separated.

Alternatively, the silicon oxide particles having the larger particle size may be present in a lower portion of the particle layer 12, and the silicon oxide particles having the smaller particle size may be present in an upper portion of the particle layer 12.

As described above, according to the method for manufacturing a semiconductor device according to the seventh embodiment, it is possible to reuse the support substrate in the manufacturing of a semiconductor device using a bonding technique, as in the first embodiment.

Eighth Embodiment

A method for manufacturing a semiconductor device according to an eighth embodiment differs from the method for manufacturing a semiconductor device according to the first embodiment in that a plurality of protrusions is formed on a surface of the first substrate before the formation of the first layer. In the description below, explanation of some of the aspects that are the same as the method for manufacturing a semiconductor device according to the first embodiment will not be repeated.

Figure 25:
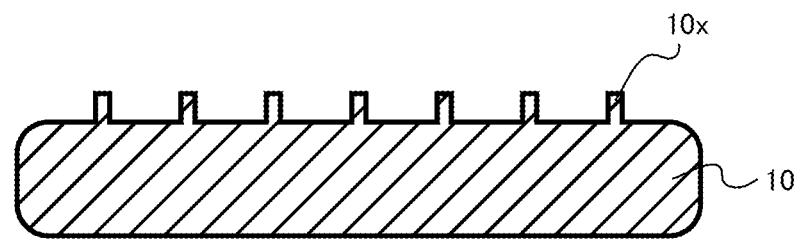
FIG. 25 is a diagram for explaining a method for manufacturing a semiconductor device according to an eighth embodiment.
Figure 26:
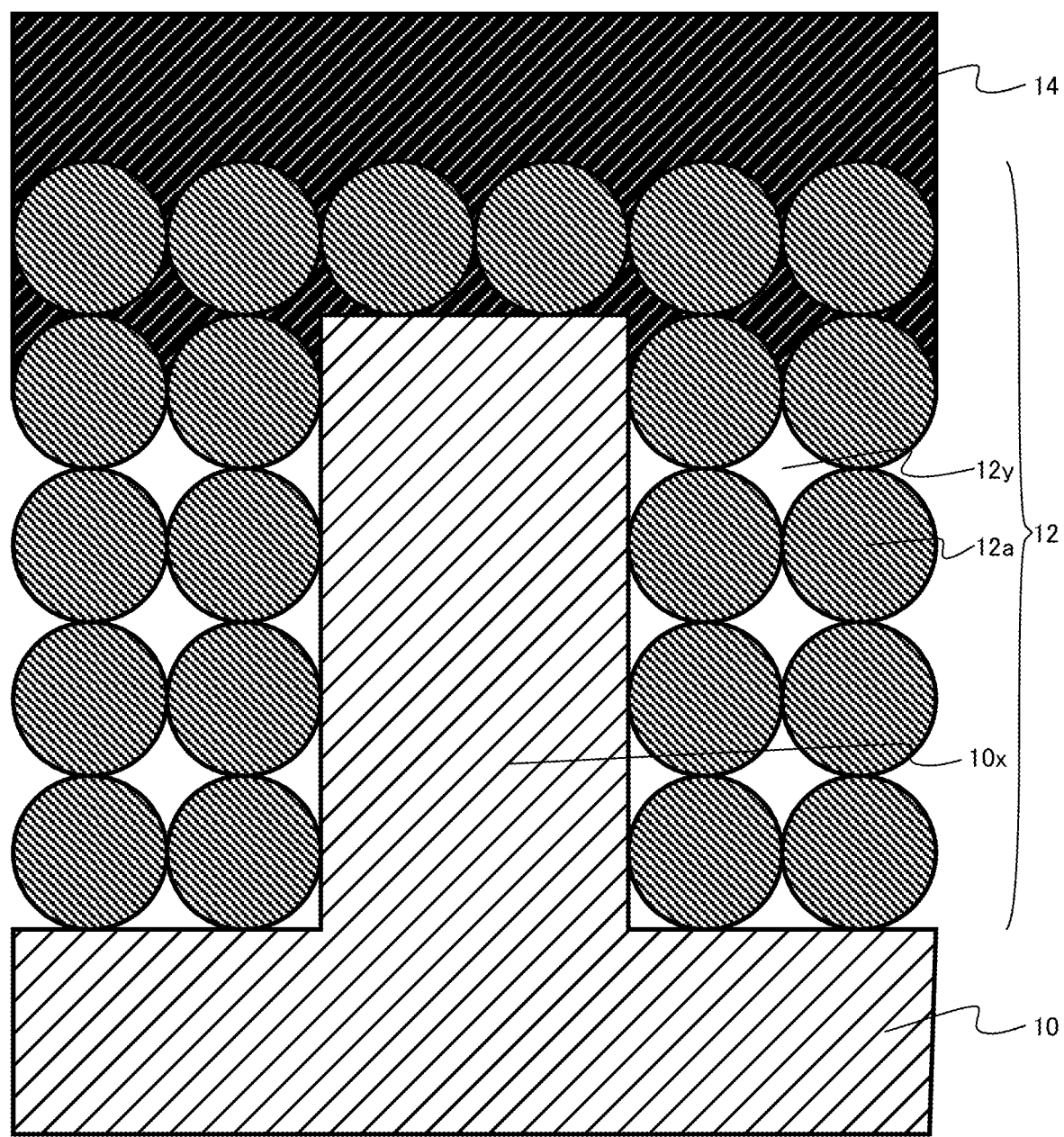
FIG. 26 is a diagram for explaining a method for manufacturing a semiconductor device according to the eighth embodiment.

FIGS. 25 and 26 are diagrams for explaining the method for manufacturing a semiconductor device according to the eighth embodiment.

As shown in FIG. 25, a plurality of protrusions 10x is formed on a surface of the support substrate 10. The protrusions 10x each have a columnar shape, for example.

The protrusions 10x are made of the same material as the support substrate 10. For example, in a case where the support substrate 10 is single-crystal silicon, the protrusions 10x are single-crystal silicon.

The protrusions 10x are formed in the manner described below, for example. First, a mask material having a pattern is formed on a surface of the support substrate 10. With the mask material serving as a mask, etching is then performed on the support substrate 10, so that the protrusions 10x are formed. After that, the mask material is removed.

FIG. 26 is an enlarged schematic cross-sectional view of part of the support substrate 10, part of the particle layer 12, and part of the protective layer 14 after the formation of the particle layer 12 and the protective layer 14 on the support substrate 10.

The upper surface of each protrusion 10x is formed so as to be in contact with the protective layer 14, for example.

The presence of the protrusions 10x in the particle layer 12 increases the mechanical strength of the particle layer 12. Thus, the bonding strength between the support substrate 10 and the semiconductor substrate 20 is increased.

As described above, according to the method for manufacturing a semiconductor device according to the eighth embodiment, it is possible to reuse the support substrate in the manufacturing of a semiconductor device using a bonding technique, as in the first embodiment.

Ninth Embodiment

A method for manufacturing a semiconductor device according to a ninth embodiment differs from the method for manufacturing a semiconductor device according to the eighth embodiment in that the material of the plurality of protrusions is different from the material of the support substrate. In the description below, explanation of some of the aspects that are the same as the method for manufacturing a semiconductor device according to the eighth embodiment will not be repeated.

Figure 27:
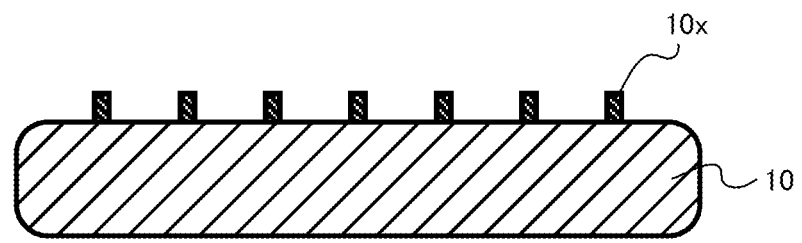
FIG. 27 is a diagram for explaining a method for manufacturing a semiconductor device according to a ninth embodiment.
Figure 28:
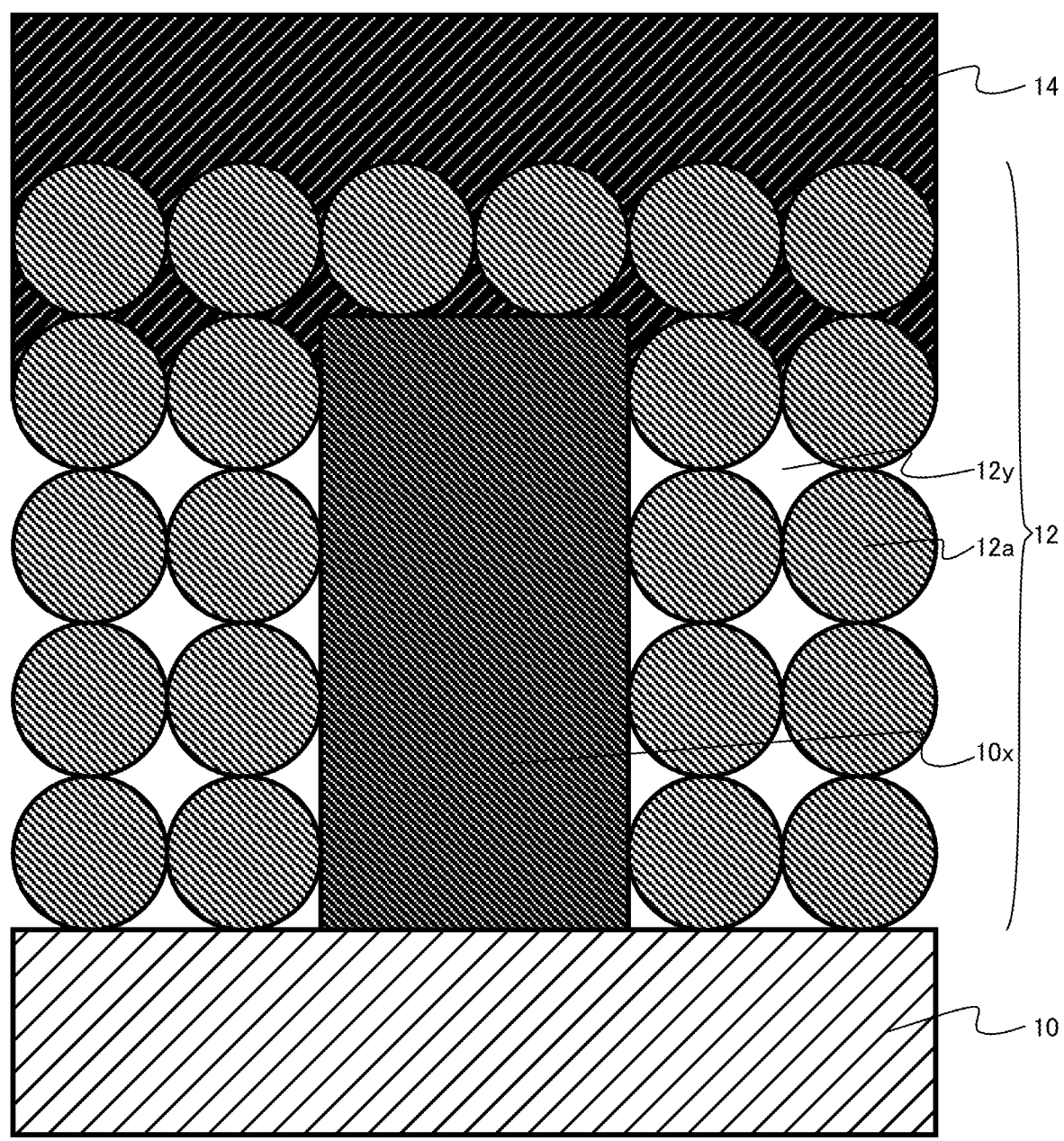
FIG. 28 is a diagram for explaining a method for manufacturing a semiconductor device according to the ninth embodiment.

FIGS. 27 and 28 are diagrams for explaining the method for manufacturing a semiconductor device according to the ninth embodiment.

As shown in FIG. 27, a plurality of protrusions 10x is formed on a surface of the support substrate 10. The protrusions 10x each have a columnar shape, for example.

The protrusions 10x are made of a different material from that of the support substrate 10. For example, in a case where the support substrate 10 is single-crystal silicon, the protrusions 10x are insulators, for example. The protrusions 10x are made of a silicon oxide, a silicon nitride, or a silicon oxynitride, for example. The protrusions 10x may be made of polycrystalline silicon or amorphous silicon, for example.

The protrusions 10x are formed in the manner described below, for example. An insulating film is formed on a surface of the support substrate 10. A mask material having a pattern is then formed. With the mask material serving as a mask, etching is performed on the insulating film, so that the protrusions 10x are formed. After that, the mask material is removed.

FIG. 28 is an enlarged schematic cross-sectional view of part of the support substrate 10, part of the particle layer 12, and part of the protective layer 14 after the formation of the particle layer 12 and the protective layer 14 on the support substrate 10.

The upper surface of each protrusion 10x is formed so as to be in contact with the protective layer 14, for example.

The presence of the protrusions 10x in the particle layer 12 increases the mechanical strength of the particle layer 12. Thus, the bonding strength between the support substrate 10 and the semiconductor substrate 20 is increased.

As described above, according to the method for manufacturing a semiconductor device according to the ninth embodiment, it is possible to reuse the support substrate in the manufacturing of a semiconductor device using a bonding technique, as in the first embodiment.

In the first to ninth embodiments, a three-dimensional NAND flash memory is described as an example of the semiconductor device to be manufactured, a memory cell array is described an example of an electronic circuit, and a control circuit that controls operations of the memory cell array is described as an example of a semiconductor circuit. However, the semiconductor device to be manufactured, the electronic circuit, and the semiconductor circuit are not limited to the above examples. For example, the semiconductor device to be manufactured may be an optical sensor, the electronic circuit may be a light receiving unit, and the semiconductor circuit may be a control circuit of the light receiving unit.

While certain embodiments have been described, these embodiments have been presented by way of example only, and are not intended to limit the scope of the inventions. Indeed, the method for manufacturing a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a first layer by applying a liquid containing silicon oxide particles onto a first substrate;
    performing a first heat treatment after the forming the first layer;
    forming a second layer including a first insulator on an upper surface and a side surface of the first layer, after the performing the first heat treatment;
    forming a third layer including an electronic circuit on the second layer;
    bonding a second substrate including a semiconductor circuit to the third layer; and
    separating the first substrate and the second substrate, the first substrate integrated with one part of the first layer and the second substrate integrated with another part of the first layer after the separating.

2. The method for manufacturing a semiconductor device according to claim 1, further comprising:
    forming a region in the first layer before the forming the second layer, the region being in contact with at least some of the silicon oxide particles and the first substrate and including a second insulator.

3. The method for manufacturing a semiconductor device according to claim 2, wherein the second insulator is silicon oxide or silicon nitride.

4. The method for manufacturing a semiconductor device according to claim 1, wherein a particle size distribution of the silicon oxide particles includes a bimodal distribution.

5. The method for manufacturing a semiconductor device according to claim 4, wherein
    the silicon oxide particles include first silicon oxide particles having a first particle size and second silicon oxide particles having a second particle size, the liquid includes a first liquid containing the first silicon oxide particles and a second liquid containing the second silicon oxide particles, and the forming the first layer includes application of the first liquid followed by application of the second liquid.

6. The method for manufacturing a semiconductor device according to claim 1, wherein the first heat treatment is performed in an oxidizing atmosphere.

7. The method for manufacturing a semiconductor device according to claim 1, wherein a temperature of the first heat treatment is 800° C. or higher.

8. The method for manufacturing a semiconductor device according to claim 1, further comprising:

performing a treatment in an atmosphere containing an organosilicon compound, after the performing the first heat treatment and before the forming the second layer.

9. The method for manufacturing a semiconductor device according to claim 8, further comprising:

performing a second heat treatment after the performing the treatment.

10. The method for manufacturing a semiconductor device according to claim 1, further comprising:

planarizing the second layer after the forming the second layer and before the forming the third layer.

11. The method for manufacturing a semiconductor device according to claim 1, further comprising:

removing the second layer from the side surface of the first layer, before the separating the first substrate and the second substrate.

12. The method for manufacturing a semiconductor device according to claim 1, further comprising:

forming a plurality of protrusions on a surface of the first substrate, before the forming the first layer.

13. The method for manufacturing a semiconductor device according to claim 1, wherein the first substrate includes a silicon oxide film provided on a surface of the first substrate.

14. The method for manufacturing a semiconductor device according to claim 1, wherein the electronic circuit includes a memory cell array, and the semiconductor circuit controls an operation of the memory cell array.

15. The method for manufacturing a semiconductor device according to claim 1, further comprising:

removing the one part of the first layer from the first substrate, after the separating the first substrate and the second substrate.

16. The method for manufacturing a semiconductor device according to claim 1, wherein a median particle size of the silicon oxide particles is equal to or more than 10 nm and equal to or less than 500 nm.

17. The method for manufacturing a semiconductor device according to claim 1, wherein a thickness of the first layer is equal to or more than 0.5 µm and equal to or less than 5 µm.

18. The method for manufacturing a semiconductor device according to claim 1, wherein the first insulator is silicon oxide or silicon nitride.

19. The method for manufacturing a semiconductor device according to claim 1, wherein the first substrate and the second substrate include a silicon substrate.

* * * * *